US012162800B2

(12) United States Patent
Guo et al.

(10) Patent No.: US 12,162,800 B2
(45) Date of Patent: Dec. 10, 2024

(54) BORON-CONTAINING GLASS COMPOSITIONS HAVING HIGH FRACTURE TOUGHNESS

(71) Applicant: CORNING INCORPORATED, Corning, NY (US)

(72) Inventors: Xiaoju Guo, Pittsford, NY (US); Peter Joseph Lezzi, Corning, NY (US); Jian Luo, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 701 days.

(21) Appl. No.: 17/095,830

(22) Filed: Nov. 12, 2020

(65) Prior Publication Data

US 2021/0147280 A1 May 20, 2021

Related U.S. Application Data

(60) Provisional application No. 62/937,868, filed on Nov. 20, 2019.

(51) Int. Cl.
| | | |
|---|---|---|
| C03C 3/091 | (2006.01) | |
| C03C 4/18 | (2006.01) | |
| C03C 21/00 | (2006.01) | |
| H05K 5/00 | (2006.01) | |
| H05K 5/03 | (2006.01) | |

(52) U.S. Cl.
CPC ............ C03C 3/091 (2013.01); C03C 4/18 (2013.01); H05K 5/0017 (2013.01); H05K 5/03 (2013.01); C03C 21/002 (2013.01); C03C 2204/00 (2013.01)

(58) Field of Classification Search
CPC .......... C03C 3/091; C03C 21/002; C03C 4/18
See application file for complete search history.

(56) References Cited

U.S. PATENT DOCUMENTS

| | | |
|---|---|---|
| 3,785,836 A | 1/1974 | Bacon |
| 3,804,646 A | 4/1974 | Dumbaugh, Jr. |
| 3,811,901 A | 5/1974 | Bacon |
| 6,268,304 B1 | 7/2001 | Maeda et al. |
| 7,192,898 B2 | 3/2007 | Mori et al. |
| 8,304,078 B2 | 11/2012 | Varshneya |
| 8,361,917 B2 | 1/2013 | Li et al. |
| 8,652,978 B2 | 2/2014 | Dejneka et al. |
| 8,796,165 B2 | 8/2014 | Ellison et al. |
| 8,854,623 B2 | 10/2014 | Fontaine et al. |
| 8,969,226 B2 | 3/2015 | Dejneka et al. |
| 9,096,460 B2 | 8/2015 | Brix et al. |
| 9,145,333 B1 | 9/2015 | Dejneka et al. |
| 9,212,084 B2 | 12/2015 | Wang et al. |
| 9,682,885 B2 | 6/2017 | Gross |
| 9,695,081 B2 | 7/2017 | Bookbinder et al. |
| 9,701,580 B2 | 7/2017 | Smedskjaer et al. |
| 2009/0239102 A1 | 9/2009 | Nagashima et al. |
| 2011/0092353 A1 | 4/2011 | Amin et al. |
| 2012/0188663 A1 | 7/2012 | Osakabe et al. |
| 2013/0045375 A1 | 2/2013 | Gross |
| 2014/0141226 A1 | 5/2014 | Bookbinder et al. |
| 2015/0140325 A1 | 5/2015 | Gross et al. |
| 2016/0102011 A1 | 4/2016 | Hu et al. |
| 2016/0102014 A1 | 4/2016 | Hu et al. |
| 2016/0347651 A1 | 12/2016 | Beall et al. |
| 2016/0376186 A1 | 12/2016 | Gross |
| 2017/0174557 A1 | 6/2017 | Gross et al. |
| 2017/0197869 A1 | 7/2017 | Beall et al. |
| 2019/0127265 A1 | 5/2019 | Dejneka et al. |
| 2019/0300422 A1 | 10/2019 | Guo et al. |
| 2022/0274865 A1 | 9/2022 | Gross et al. |

FOREIGN PATENT DOCUMENTS

| | | |
|---|---|---|
| CN | 105916824 A | 8/2016 |
| CN | 108698909 A | 10/2018 |
| JP | 05-744068 A | 3/1993 |
| JP | 2001-134925 A | 5/2001 |
| JP | 2011-034925 A | 2/2011 |
| WO | 2012/126394 A1 | 9/2012 |
| WO | 2016/191676 A1 | 12/2016 |

OTHER PUBLICATIONS

"Bubsey, R.T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (Oct. 1992)".
"Reddy, K.P.R. et al, "Fracture Toughness Measurement of Glass and Ceramic Materials Using Chevron-Notched Specimens," J. Am. Ceram. Soc., 71 [6], C-310-C-313 (1988)".
Eagan et al., "Effect of Composition on the Mechanical Properties of Aluminosilicate and Borosilicate Glasses". J. Am. Ceram. Soc. 61, 27-30, doi:10.1111/j.1151-2916.1978.tb09222.x (1978).
Luo, Jian and et. al., Structural origin of intrinsic ductility in binary aluminosilicate glasses, Journal of Non-Crystalline Solids, 452, 297-306.
Rosales-Sosa, G. A. et al. High Elastic Moduli of a 54Al2O3—46Ta2O5 Glass Fabricated via Containerless Processing. Sci Rep 5, 15233.
Rosales-Sosa, G. A., Masuno, A., Higo, Y. & Inoue, H. Crack-resistant Al2O3—SiO2 glasses. Sci Rep 6, 23620, doi:10.1038/srep23620 (2016).
Rouxel, T. & Yoshida, S. The Fracture Toughness of Inorganic Glasses. J. Am. Cheram. Soc. 100, 4374-4396, doi:10.1111/jace.15108 (2017).
Shi, Y., Luo, J., Yuan, F. & Huang, L. Intrinsic ductility of glassy solids. Journal of Applied Physics 115, 043528.

(Continued)

Primary Examiner — Elizabeth A. Bolden

(57) ABSTRACT

Glass compositions including 50 mol % to 65 mol % $SiO_2$, 13 mol % to 20 mol % $Al_2O_3$, 6 mol % or more $B_2O_3$, 0 mol % to 5 mol % MgO, 0 mol % to 2 mol % CaO, 8 mol % to 14 mol % $Li_2O$, 0 mol % to 4 mol % $Na_2O$, and 0 mol % to 1 mol % $K_2O$, where $Al_2O_3$ mol %>$R_2O$+R'O−3 mol %. The glass compositions may have a $K_{1C}$ value of 0.75 MPa*m$^{1/2}$ or more measured by a chevron short bar method. The glass compositions may be used in a glass article or consumer electronic product.

15 Claims, 2 Drawing Sheets

(56) References Cited

OTHER PUBLICATIONS

Zhang et al., A novel upconversion TiO2—La2O3—Ta2O5 bulk glass co-doped with Er3+/Yb3+ fabricated by containerless processing. Materials Letters 66, 367-369.

International Search Report and Written Opinion of the International Searching Authority; PCT/US2020/060082; dated Jul. 29, 2021; 11 pages; European Patent Office.

Chinese Patent Application No. 202080080906.2, Office Action dated Aug. 4, 2023, 5 pages English Translation only), Chinese Patent Office.

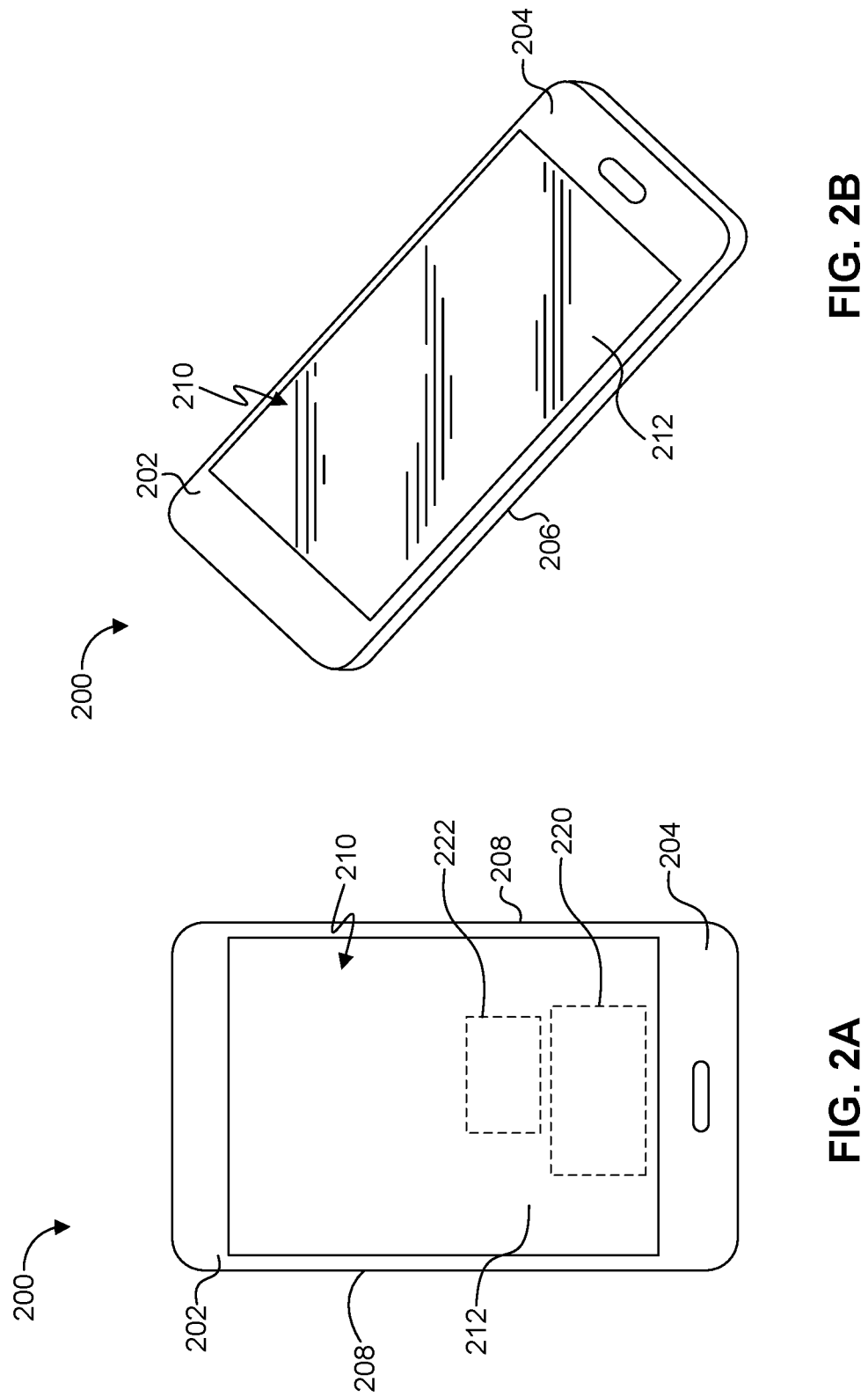

BORON-CONTAINING GLASS COMPOSITIONS HAVING HIGH FRACTURE TOUGHNESS

This application claims the benefit of priority under 35 U.S.C. § 119 of U.S. Provisional Application Ser. No. 62/937,868 filed on Nov. 20, 2019 the content of which is relied upon and incorporated herein by reference in its entirety.

FIELD

The present disclosure relates to boron-containing silicate glass compositions for use in as applications requiring high fracture toughness, such as cover glasses for electronic devices. In particular, the present disclosure relates to boron-containing silicate glass compositions that are peraluminous or near-peraluminous.

BACKGROUND

Many consumer products, such as smart phones, tablets, portable media players, personal computers, and cameras, incorporate cover glasses, which may function as display covers, and may incorporate touch functionality. Frequently, these devices are dropped by users onto hard surfaces, which causes damage to the cover glasses, and may negatively impact the use of the devices, e.g., the touch functionality may be compromised.

Glass can be made more resistant to flexure failure through ion-exchange processes, which involve inducing compressive stresses on the glass surfaces. However, ion-exchanged glasses are still susceptible to dynamic sharp contact failure due to high stress concentrations caused by local indentations in the glass caused by sharp contact. Sharp contact failure may be mitigated through use of coatings on the cover glass and the addition of bezels to the devices, which may prevent the cover glass from directly impacting hard surfaces if dropped. Due to the constraints of aesthetic and functional requirements of the devices, though, it is difficult to completely prevent impact.

Accordingly, a need exists for glass compositions having high strength and fracture toughness, which may be manufactured with the size, thickness, and functionality specifications for consumer product applications, such as cover glass applications.

BRIEF SUMMARY

The present disclosure is directed to glass compositions having suitable fracture toughness for high impact applications, such as cover glass applications for various electronic devices. Glass compositions disclosed herein may be capable of ion exchange, for example in a molten salt bath, to increase resistance to flexure failure. The glass compositions may include lithium to facilitate ion exchange. In some embodiments, glass compositions disclosed herein may be substantially free of expensive oxides, for example $ZrO_2$, $Ta_2O_5$, $TiO_2$, $HfO_2$, $La_2O_3$, and/or $Y_2O_3$ that can increase fracture toughness. Instead, an excess of $Al_2O_3$ may be present in the compositions such that the amount of $Al_2O_3$ a composition is greater than, or nearly greater than, the sum of all of the alkali metal oxides and all of the alkaline earth metal oxides also present in the composition. In other words, the compositions may be peraluminous or nearly-peraluminous. The excess of $Al_2O_3$ may cause the $B_2O_3$ in the compositions to be in the trigonal configuration, which may benefit the fracture toughness properties of the compositions.

A first aspect (1) of the present application is directed to a glass article, the glass article including 50 mol % to 65 mol % $SiO_2$; 13 mol % to 20 mol % $Al_2O_3$; 6 mol % $B_2O_3$ or more; 0 mol % to 5 mol % MgO; 0 mol % to 2 mol % CaO; 8 mol % to 14 mol % $LiO_2$; 0 mol % to 4 mol % $Na_2$; and 0 mol % to 1 mol % $K_2O$, where $Al_2O_3$ mol %>$R_2O$+R'O−3 mol %, $R_2O$ is the total mol % of alkali metal oxides, and R'O is the total mol % of alkaline earth metal oxides.

In a second aspect (2), a glass article according to the first aspect (1) is provided and $Al_2O_3$ mol %>$R_2O$+R'O.

In a third aspect (3), a glass article according to either of the first aspect (1) or the second aspect (2) is provided and $R_2O$+R'O+4 mol %>$Al_2O_3$ mol %>$R_2O$+R'O−3 mol %.

In a fourth aspect (4), the glass article according to any of aspects (1)-(3) is provided and the $B_2O_3$ includes trigonal boron oxide.

In a fifth aspect (5), the glass article according to the fourth aspect (4) is provided and 50 mol % or more of the $B_2O_3$ is trigonal boron oxide.

In a sixth aspect (6), the glass article according to the fourth aspect (4) is provided and 75 mol % or more of the $B_2O_3$ is trigonal boron oxide.

In a seventh aspect (7), the glass article according to the fourth aspect (4) is provided and 90 mol % or more of the $B_2O_3$ is trigonal boron oxide.

In an eighth aspect (8), the glass article according to any of aspects (1)-(7) is provided and includes 8 mol % or more of $B_2O_3$.

In a ninth aspect (9), the glass article according to any of aspects (1)-(8) is provided and includes 8 mol % to 12 mol % $B_2O_3$.

In a tenth aspect (10), the glass article according to any of aspects (1)-(9) is provided and the alkali metal oxides consist of: $Li_2O$, $Na_2O$, and $K_2O$.

In an eleventh aspect (11), the glass article according to any of aspects (1)-(10) is provided and the alkaline earth metals consist of: MgO and CaO.

In a twelfth aspect (12), the glass article according to any of aspects (1)-(11) is provided and is substantially free of $ZrO_2$, $Ta_2O_5$, $TiO_2$, $HFO_2$, $La_2O_3$, and $Y_2O_3$.

In a thirteenth aspect (13), the glass article according to any of aspects (1)-(11) is provided and is free of $ZrO_2$, $Ta_2O_5$, $TiO_2$, $HFO_2$, $La_2O_3$, and $Y_2O_3$.

In a fourteenth aspect (14), the glass article according to any of aspects (1)-(13) is provided and further includes $TiO_2$ in a range of 0 mol % to 2 mol %.

In a fifteenth aspect (15), the glass article according to any of aspects (1)-(14) is provided and further includes $ZrO_2$ in a range of 0 mol % to 2 mol %.

In a sixteenth aspect (16), the glass article according to any of aspects (1)-(15) is provided and further includes $SnO_2$ in a range of 0 mol % to 2 mol %.

In a seventeenth aspect (17), the glass article according to any of aspects (1)-(16) is provided and further includes $Fe_2O_3$ in a range of 0 mol % to 0.1 mol %.

In an eighteenth aspect (18), the glass article according to any of aspects (1)-(17) is provided and the amount of $Al_2O_3$+the amount of $B_2O_3$ is 20 mol % or more.

In a nineteenth aspect (19), the glass article according to any of aspects (1)-(17) is provided and the amount of $Al_2O_3$+the amount of $B_2O_3$ is 24 mol % or more.

In a twentieth aspect (20), the glass article according to any of aspects (1)-(19) is provided and $R_2O$<15 mol %.

In a twenty-first aspect (21), the glass article according to any of aspects (1)-(20) is provided and includes less than 3 mol % $Na_2O$.

In a twenty-second aspect (22), the glass article according to any of aspects (1)-(21) is provided and has a $K_{1C}$ value of 0.75 $MPa*m^{1/2}$ or more.

In a twenty-third aspect (23), the glass article according to any of aspects (1)-(22) is provided and has a liquidus viscosity of 1000 Poise or more.

In a twenty-fourth aspect (24), the glass article according to any of aspects (1)-(23) is provided and includes a compressive stress region extending from a surface of the glass article to a depth of compression.

In a twenty-fifth aspect (25), the glass article according to aspect (24) is provided and the compressive stress region includes a compressive stress of 400 IPa or more. The compressive stress may be 400 Pa to 775 MIPa, 400 IPa to 1000 IPa, or 400 IPa to 2000 MPa.

In a twenty-sixth aspect (26), the glass article according to either of aspects (24) or (25) is provided and the depth of compression is 15% or more of a thickness of the glass article.

In a twenty-seventh aspect (27), the glass article according to any of aspects (24)-(26) is provided and the compressive stress region includes a concentration of a metal oxide that is different at two or more points through a thickness of the glass article.

In a twenty-eighth aspect (28), the glass article according to any of aspects (1)-(27) is provided and includes a glass composition that falls on or in a convex hull defined by the compositions of Tables 1, 2, and 3.

A twenty-ninth aspect (29) of the present application is directed to a glass article, the glass article including $SiO_2$; $Al_2O_3$; $B_2O_3$; and $Li_2O$, where $Al_2O_3$ mol %>$R_2O+R'O-3$ mol %, $R_2O$ is the total mol % of alkali metal oxides, R'O is the total mol % of alkaline earth metal oxides, and the glass article has a $K_{1C}$ value of 0.75 MPa*m/2 or more.

In a thirtieth aspect (30), the glass article according to aspect (29) is provided and $Al_2O_3$ mol %>$R_2O+R'O$.

In a thirty-first aspect (31), the glass article according to either of the twenty-ninth aspect (29) or the thirtieth aspect (30) is provided and includes 8 mol % or more of $B_2O_3$.

In a thirty-second aspect (32), the glass article according to either of the twenty-ninth aspect (29) or the thirtieth aspect (30) is provided and includes 6 mol % to 16 mol % $B_2O_3$.

In a thirty-third aspect (33), the glass article according to any of aspects (29)-(32) is provided and the $B_2O_3$ includes trigonal boron oxide.

In a thirty-fourth aspect (34), the glass article according to the thirty-third aspect (33) is provided and 90 mol % or more of the $B_2O_3$ is trigonal boron oxide.

In a thirty-fifth aspect (35), the glass article according to any of aspects (29)-(34) is provided and the amount of $Al_2O_3$+the amount of $B_2O_3$ is 20 mol % or more.

In a thirty-sixth aspect (36), the glass article according to any of aspects (29)-(35) is provided and the alkali metal oxides consist of: $Li_2O$, $Na_2O$, and $K_2O$, and the alkaline earth metal oxides consist of: MgO and CaO.

In a thirty-seventh aspect (37), the glass article according to any of aspects (29)-(36) is provided and includes a compressive stress region extending from a surface of the glass article to a depth of compression, the compressive stress region including: a concentration of a metal oxide that is different at two or more points through a thickness of the glass article, and a compressive stress of 400 MPa or more.

A thirty-eighth aspect (38) of the present application is directed to a consumer electronic product, the consumer electronic product including a housing having a front surface, a back surface, and side surfaces; electrical components provided at least partially within the housing, the electrical components including at least a controller, a memory, and a display, the display being provided at or adjacent the front surface of the housing; and a cover glass disposed over the display, where at least one of a portion of the housing or a portion of the cover glass includes a glass article, the glass article including: 50 mol % to 65 mol % $SiO_2$; 13 mol % to 20 mol % $Al_2O_3$; 6 mol % $B_2O_3$ or more; 0 mol % to 5 mol % MgO; 0 mol % to 2 mol % CaO; 8 mol % to 14 mol % $Li_2O$; 0 mol % to 4 mol % $Na_2O$; and 0 mol % to 1 mol % $K_2O$, where $Al_2O_3$ mol %>$R_2O+R'O-3$ mol %, $R_2O$ is the total mol % of alkali metal oxides, and R'O is the total mol % of alkaline earth metal oxides.

In a thirty-ninth aspect (39), the consumer electronic product according to the thirty-eighth aspect (38) is provided and includes 8 mol % of $B_2O_3$.

In a fortieth aspect (40), the consumer electronic product according to the thirty-eighth aspect (38) is provided and includes 6 mol % to 16 mol % $B_2O_3$.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

FIG. 2A is a plan view of an exemplary electronic device incorporating a glass article according to any of the glass articles disclosed herein. FIG. 2B is a perspective view of the exemplary electronic device of FIG. 2A.

DETAILED DESCRIPTION

Figure 1:
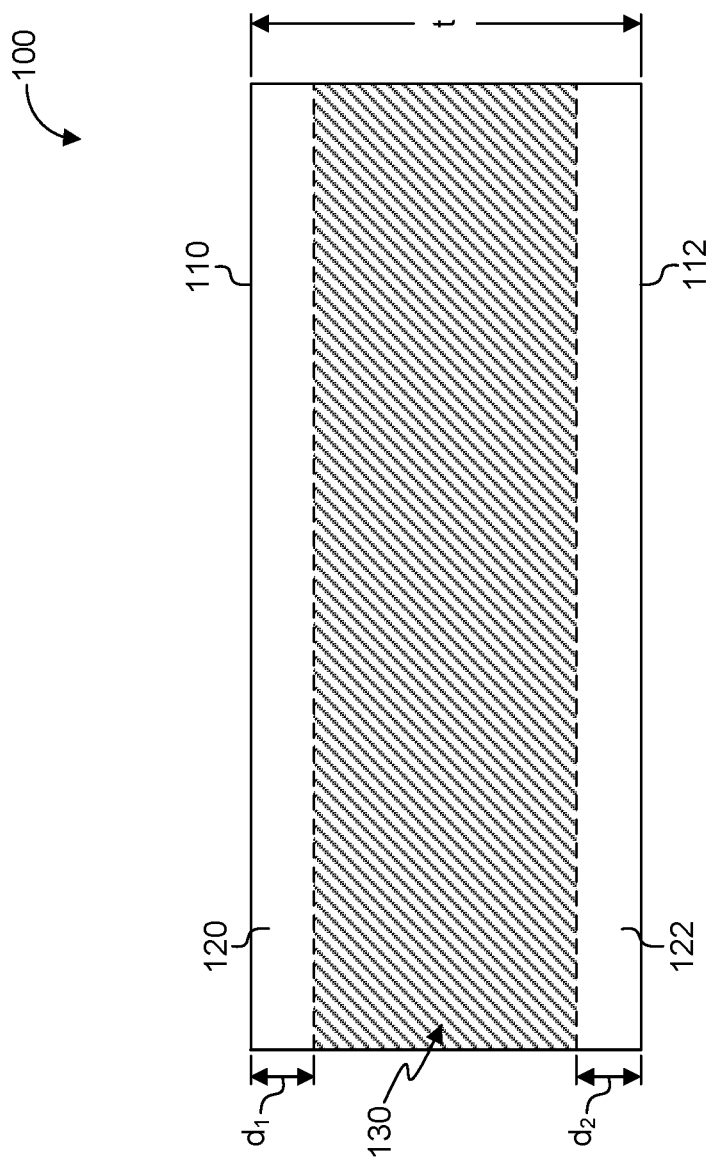
FIG. 1 depicts a cross section of a glass having compressive stress regions according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Consumer products, such as portable electronic devices, for example smart phones tablets, portable media players, personal computers, and cameras, often include cover glass disposed over displays, for example, to provide protection from dirt, water, hand oils, etc. Often, cover glass incorporates touch functionality, and is therefore integral to the overall functionality of the device. Because of the portable nature of these devices, however, they are frequently dropped, which may fracture the cover glass and significantly impair the functionality of the device. Accordingly, the glass articles used as cover glass need to have high fracture toughness in order to resist cracking upon impact.

There are two major failure modes of cover glass when it impacts a hard surface. One mode is flexure failure, which is caused by bending of the glass when the device is subjected to dynamic load due to impact with the hard surface. The other mode is sharp contact failure, which is caused by introduction of damage to the glass surface.

Glass can be made more resistant to flexure failure through ion-exchange processes, which involves inducing compressive stresses on the glass surfaces, for example in a molten salt bath. Although the ion-exchanged glass articles have increased strength, they can still be susceptible to dynamic sharp contact failure. Sharp contact failure is caused by high, localized, stress concentrations due to impact of the glass with rough, and/or hard surfaces, such as asphalt, granite, corners of furniture, etc. These stress concentrations can result in sharp indentations in the glass surface. And these indentations may become failure sites in the glass surface at which cracks may develop and propagate.

Glass compositions disclosed herein are designed to avoid flexure failure and sharp contact failure when utilized on a consumer product without the addition of a bezel or similar structural support. In particular, the glass compositions disclosed herein are designed to be prealuminous or near-peraluminous and contain significant amounts of trigonal boron. The boron oxide content of the glass compositions is tailored relative to other oxides to achieve desired properties, such as fracture toughness, manufacturability, and ion exchange ability.

As used herein, the term "glass-based material" is meant to include any material made at least partially of glass, including glass and glass-ceramics. "Glass-ceramics" include materials produced through controlled crystallization of glass. One or more nucleating agents, for example, titanium oxide ($TiO_2$), zirconium oxide ($ZrO_2$), sodium oxide ($Na_2O$), and phosphorus oxide ($P_2O_5$) may be added to a glass-ceramic composition to facilitate homogenous crystallization. The term "glass" does not include glass-ceramics.

Glass compositions disclosed herein include $Al_2O_3$. As discussed herein, $Al_2O_3$ can be effective in increasing the fracture toughness of a glass composition, particularly when the amount of $Al_2O_3$ in the composition exceeds, or nearly exceeds, the sum of the total amount of alkali metal oxides and the total amount of alkaline earth metal oxides such that the composition may be classified as peraluminous, or nearly-peraluminous. A problem with peraluminous or nearly-peraluminous compositions, however, is that the excess $Al_2O_3$ may cause difficulties with melting and devitrification.

The addition of $B_2O_3$ to glass compositions as disclosed herein may serve to significantly improve fracture toughness, particularly when it is in a trigonal configuration. Boron oxide in this configuration demonstrates improved Knoop scratch threshold performance. Boron oxide may, however, reduce the achievable central tension (CT) during ion exchange. Boron oxide concentrations, and the relationship between these concentrations and other oxides, disclosed herein are designed to achieve glass compositions with desired properties including ion exchange properties. When $B_2O_3$ is added to a glass composition having an excess of $Al_2O_3$ as disclosed herein, the frangibility limit of the composition remains high, and ion exchange of glass substrates with such a composition may still be performed in a molten salt bath having high sodium content. Also, substrates with this composition may have a suitably high rate of ion exchange.

For glass compositions described herein, the concentration of constituent components (e.g., $SiO_2$, $Al_2O_3$, $Li_2$, and the like) are given in mole percent (mol %) on an oxide basis, unless otherwise specified. Components of the glass compositions according to embodiments are discussed individually below. It should be understood that any of the variously recited ranges of one component may be individually combined with any of the variously recited ranges for any other component. As used herein, a trailing 0 in a number is intended to represent a significant digit for that number. For example, the number "1.0" includes two significant digits, and the number "1.00" includes three significant digits. As used herein, a composition described as including an oxide within a range defined by 0 mol % as the lower bound means that the composition includes the oxide at any amount above 0 mol % (e.g., 0.01 mol % or 0.1 mol %) and up the upper bound of the range.

Glass compositions disclosed herein exhibit a high fracture toughness ($K_{1C}$) while also exhibiting a degree of manufacturability that enables efficient production of glass articles having the compositions. In some embodiments, the glass compositions are characterized by a $K_{1C}$ fracture toughness value measured by a chevron short bar method of 0.75 MPa*m$^{1/2}$ or more.

In some embodiments, $SiO_2$ may be the largest constituent in the glass composition and, as such, is the primary constituent of the glass network formed from the glass composition. Pure $SiO_2$ has a relatively low CTE and is alkali free. However, pure $SiO_2$ has a high melting point. Accordingly, if the concentration of $SiO_2$ in the glass composition is too high, the formability of the glass composition may be diminished as higher concentrations of $SiO_2$ increase the difficulty of melting the glass, which, in turn, adversely impacts the formability of the glass.

In some embodiments, the glass composition may include $SiO_2$ in an amount from greater than or equal to 50 mol % to less than or equal to 65 mol %, and all ranges and sub-ranges between the foregoing values. For example, the glass composition may include $SiO_2$ in amounts greater than or equal to 51 mol %, such as greater than or equal to 52 mol %, greater than or equal to 53 mol %, greater than or equal to 54 mol %, greater than or equal to 55 mol %, greater than or equal to 56 mol %, greater than or equal to 57 mol %, greater than or equal to 58 mol %, greater than or equal to 59 mol %, greater than or equal to 60 mol %, greater than or equal to 61 mol %, greater than or equal to 62 mol %, greater than or equal to 63 mol %, or greater than or equal to 64 mol %. In some embodiments, the glass composition may include $SiO_2$ in amounts less than or equal to 65 mol %, such as less than or equal to 64 mol %, less than or equal to 63 mol %, less than or equal to 62 mol %, less than or equal to 61 mol %, less than or equal to 60 mol %, less than or equal to 59 mol %, less than or equal to 58 mol %, less than or equal to 57 mol %, less than or equal to 56 mol %, less than or equal to 55 mol %, less than or equal to 54 mol %, less than or equal to 53 mol %, less than or equal to 52 mol %, or less than or equal to 51 mol %.

Any of the above ranges may be combined with any other range. For example, in some embodiments, the glass composition may include $SiO_2$ in an amount from greater than or equal to 51 mol % to less than or equal to 64 mol %, such as from greater than or equal to 52 mol % to less than or equal to 63 mol %, from greater than or equal to 53 mol % to less than or equal to 62 mol %, from greater than or equal to 54 mol % to less than or equal to 61 mol %, from greater than or equal to 55 mol % to less than or equal to 60 mol %, from greater than or equal to 56 mol % to less than or equal to 59 mol %, from greater than or equal to 57 mol % to less than or equal to 58 mol %, and all ranges and sub-ranges between the foregoing values having any two of the above-listed SiO$_2$ values as endpoints, including the endpoints.

Glass compositions disclosed herein include Al$_2$O$_3$. The addition of Al$_2$O$_3$ may serve as a glass network former. Furthermore, when the concentration of Al$_2$O$_3$ is balanced against the concentration of SiO$_2$ and the concentration of alkali oxides in the composition, it may reduce the liquidus temperature of the glass melt, thereby enhancing the liquidus viscosity.

In some embodiments, the concentration of Al$_2$O$_3$ in the composition may be greater than the sum of the total amount of alkali metal oxides plus the total amount of alkaline earth metal oxides such that the composition is peraluminous. In other words, in some embodiments, Al$_2$O$_3$ mol %>R$_2$O+R'O mol %, where R$_2$O is the total mol % of alkali metal oxides and R'O is the total mol % of alkaline earth metal oxides. In some embodiments, for a peraluminous composition, the concentration of Al$_2$O$_3$ in the composition may be no greater than 4 mol % more than the sum of the total amount of alkali metal oxides plus the total amount of alkaline earth metal oxides. So, in some embodiments, peraluminous compositions may be represented by the following formula: R$_2$O+R'O+4 mol %>Al$_2$O$_3$ mol %>R$_2$O+R'O−3 mol %. R$_2$O is less than 15 mol %. In some embodiments, the combined amount of Al$_2$O$_3$ plus B$_2$O$_3$ is 20 mol % or more. In some embodiments, the combined amount of Al$_2$O$_3$ plus B$_2$O$_3$ is 24 mol % or more. In some embodiments, the combined amount of Al$_2$O$_3$ plus B$_2$O$_3$ is 32 mol % or less. In some embodiments, the combined amount of Al$_2$O$_3$ plus B$_2$O$_3$ is 30 mol % or less.

In some embodiments, the alkali metal oxides (R$_2$O) in the composition consist of Li$_2$O, Na$_2$, and K$_2$O. In some embodiments, the alkaline earth metal oxides (R'O) consist of MgO and CaO.

In some embodiments, the concentration of Al$_2$O$_3$ in the composition may be greater or nearly greater than the sum of the total amount of alkali metal oxides plus the total amount of alkaline earth metal oxides such that the composition is peraluminous or nearly-peraluminous. In some embodiments, for a nearly-peraluminous composition, the concentration of Al$_2$O$_3$ in the composition may be no less than 3 mol % (or 2 mol %, or 1 mol %) less than the sum of the total amount of alkali metal oxides plus the total amount of alkaline earth metal oxides. So, in some embodiments, near-peraluminous compositions may be represented by the following formula: Al$_2$O$_3$ mol %>R$_2$O+R'O−3 mol %. In some embodiments, near-peraluminous compositions may be represented by the following formula: Al$_2$O$_3$ mol %>R$_2$O+R'O—2 mol %. In some embodiments, near-peraluminous compositions may be represented by the following formula: Al$_2$O$_3$ mol %>R$_2$O+R'O—1 mol %.

In some embodiments, the glass composition may include Al$_2$O$_3$ in a concentration of from greater than or equal to 13 mol % to less than or equal to 20.0 mol %, and all ranges and sub-ranges between the foregoing values. For example, the glass composition may include Al$_2$O$_3$ in amounts greater than or equal to 13 mol %, such as greater than or equal to 13.5 mol %, greater than or equal to 14 mol %, greater than or equal to 14.5 mol %, greater than or equal to 15 mol %, greater than or equal to 15.5 mol %, greater than or equal to 16 mol %, greater than or equal to 16.5 mol %, greater than or equal to 17 mol %, greater than or equal to 17.5 mol %, greater than or equal to 18 mol %, greater than or equal to 18.5 mol %, greater than or equal to 19 mol %, greater than or equal to 19.5 mol %, or equal to 20 mol %.

In some embodiments, the glass composition may include Al$_2$O$_3$ in amounts less than or equal to 20 mol %, such as less than or equal to 19.5 mol %, less than or equal to 19 mol %, less than or equal to 18.5 mol %, less than or equal to 18 mol %, less than or equal to 17.5 mol %, less than or equal to 17 mol %, less than or equal to 16.5 mol %, less than or equal to 16 mol %, less than or equal to 15.5 mol %, less than or equal to 15 mol %, less than or equal to 14.5 mol %, less than or equal to 14 mol %, less than or equal to 13.5 mol %, or equal to 13 mol %.

Any of the above ranges may be combined with any other range. For example, in some embodiments, the glass composition may include Al$_2$O$_3$ in an amount from greater than or equal to 13 mol % to less than or equal to 20 mol %, such as from greater than or equal to 13.5 mol % to less than or equal to 19.5 mol %, from greater than or equal to 14 mol % to less than or equal to 19 mol %, from greater than or equal to 14.5 mol % to less than or equal to 18.5 mol %, from greater than or equal to 15 mol % to less than or equal to 18 mol %, from greater than or equal to 15.5 mol % to less than or equal to 17.5 mol %, or from greater than or equal to 16 mol % to less than or equal to 17 mol %, and all ranges and sub-ranges between the foregoing values having any two of the above-listed Al$_2$O$_3$ values as endpoints, including the endpoints.

Glass compositions disclosed herein include B$_2$O$_3$. In some embodiments, the glass composition may include B$_2$O$_3$ in amounts from greater than or equal to 6 mol % B$_2$O$_3$ to less than or equal to 16 mol % B$_2$O$_3$, and all ranges and sub-ranges between the foregoing values. For example, the glass composition may include B$_2$O$_3$ in amounts greater than or equal to 6 mol %, such as greater than or equal to 6 mol %, greater than or equal to 6.5 mol %, greater than or equal to 7 mol %, greater than or equal to 7.5 mol %, greater than or equal to 8 mol %, greater than or equal to 8.5 mol %, greater than or equal to 9 mol %, greater than or equal to 9.5 mol %, greater than or equal to 10 mol %, greater than or equal to 10.5 mol %, greater than or equal to 11 mol %, greater than or equal to 11.5 mol %, greater than or equal to 12 mol %, greater than or equal to 12.5 mol %, greater than or equal to 13 mol %, greater than or equal to 13.5 mol %, greater than or equal to 14 mol %, greater than or equal to 14.5 mol %, greater than or equal to 15 mol %, or greater than or equal to 15.5 mol %.

In some embodiments, the glass composition may include B$_2$O$_3$ in an amount less than or equal to 16 mol %, such as less than or equal to 16 mol %, less than or equal to 15.5 mol %, less than or equal to 16 mol %, less than or equal to 14.5 mol %, less than or equal to 14 mol %, less than or equal to 13.5 mol %, less than or equal to 13 mol %, less than or equal to 12.5 mol %, less than or equal to 12 mol %, less than or equal to 11.5 mol %, less than or equal to 11 mol %, less than or equal to 10.5 mol %, less than or equal to 10 mol %, less than or equal to 9.5 mol %, less than or equal to 9 mol %, less than or equal to 8.5 mol %, less than or equal to 8 mol %, less than or equal to 7.5 mol %, less than or equal to 7 mol %, or less than or equal to 6.5 mol %.

Any of the above ranges may be combined with any other range. For example, in some embodiments, the glass composition may include B$_2$O$_3$ in amounts from greater than or equal to 6 mol % to less than or equal to 16 mol %, such as greater than or equal to 6.5 mol % to less than or equal to 15.5 mol %, greater than or equal to 7 mol % to less than or equal to 15 mol %, greater than or equal to 7.5 mol % to less than or equal to 14.5 mol %, greater than or equal to 8 mol % to less than or equal to 14 mol %, greater than or equal to 8.5 mol % to less than or equal to 13.5 mol %, greater than or equal to 9 mol % to less than or equal to 13 mol %, or greater than or equal to 9.5 mol % to less than or equal to 12.5 mol %, greater than or equal to 10 mol % to less than or equal to 12 mol %, greater than or equal to 10.5 mol % to less than or equal to 11.5 mol %, and all ranges and sub-ranges between the foregoing values having any of the above-listed $B_2O_3$ values as endpoints, including the endpoints. In some embodiments, the concentration of $B_2O_3$ in the composition may be greater than 16 mol %. In some embodiments, the concentration of $B_2O_3$ in the composition is 8 mol % or more. In some embodiments, the concentration of $B_2O_3$ in the composition is from 8 mol % to 12 mol %. In some embodiments, the concentration of $B_2O_3$ in the composition is from 6 mol % to 16 mol %.

$B_2O_3$ may also be added to the glass composition at concentrations disclosed herein to improve the fracture toughness of the composition. In some embodiments, the $B_2O_3$ in a glass composition may be in a trigonal configuration, as opposed to other possible configurations such as a tetrahedral configuration. In some embodiments, when the composition is peraluminous, or nearly-peraluminous, all or a significant portion of the $B_2O_3$ may be in a trigonal configuration. This may also improve the Knoop scratch threshold of the composition. In some embodiments, the amount of $B_2O_3$ in the trigonal configuration is greater than or equal to 50 mol % of the $B_2O_3$ in the composition, such as greater than or equal to 55 mol %, greater than or equal to 60 mol %, greater than or equal to 65 mol %, greater than or equal to 70 mol %, greater than or equal to 75 mol %, greater than or equal to 80 mol %, greater than or equal to 85 mol %, greater than or equal to 90 mol %, or greater than or equal to 95 mol %. In some embodiments, the amount of $B_2O_3$ in the trigonal configuration may be in the range of 50 mol % of the total $B_2O_3$ in the composition to 100 mol % of the $B_2O_3$ in the composition, including subranges. For example, the amount of $B_2O_3$ in the trigonal configuration may be 50 mol %, 55 mol %, 60 mol %, 65 mol %, 70 mol %, 75 mol %, 80 mol %, 85 mol %, 90 mol %, 95 mol %, or 100 mol % of the $B_2O_3$ in the composition, or within a range defined any two of these values as endpoints, including the endpoints. In some embodiments, 90 mol % or more of the $B_2O_3$ in a composition is trigonal boron oxide. In some embodiments, 75 mol % or more of the $B_2O_3$ in a composition is trigonal boron oxide. In some embodiments, 50 mol % or more of the $B_2O_3$ in a composition is trigonal boron oxide.

The amount of trigonal boron oxide present in the composition may be measured using nuclear magnetic resonance spectroscopy (NMR) using the following method. Boron coordination in a glass composition is quantified using solid-state NMR spectroscopy. Glass samples are powdered and loaded into zirconia rotors for magic-angle sample spinning at rates of 20 kHz. Data is collected using short radio-frequency pulses on the order of a π/12 tip angle such that both trigonal and tetrahedral boron resonances are uniformly excited. Magnetic field strengths of at least 11.7 teslas (T) are used to ensure separation of resonances from 3- and 4-fold coordinated boron peaks. Peak areas are used to quantify the fraction of boron in 4-fold coordination (the so-called N4 value). Care is taken to properly fit the quadrupolar line shapes and account for an overlapping satellite transition from any tetrahedral peaks. If these satellite peaks are not included in the analysis, the N4 values will be too high; on the order of 2 atom % more than the actual concentration. Unless specified otherwise, this method is how the amount of trigonal boron oxide is measured for purposes of this application.

In some embodiments, $B_2O_3$ may act as a network former, thereby reducing the meltability and formability of the glass composition. Thus, $B_2O_3$ may be added in amounts that do not overly decrease these properties.

In some embodiments, glass compositions disclosed herein may include $Li_2O$. $Li_2O$ may be included in the glass composition to improve the control of the ion exchange process and further reduce the softening point of the glass, thereby increasing the manufacturability of the glass. In some embodiments, the glass composition may include $Li_2O$ in an amount from greater than 8 mol % to less than or equal to 14 mol %, and all ranges and sub-ranges between the foregoing values. For example, the glass composition may include $Li_2O$ in amounts greater than or equal to 8 mol %, such as greater than or equal to 8 mol %, greater than or equal to 8.5 mol %, greater than or equal to 9 mol %, greater than or equal to 9.5 mol %, greater than or equal to 10 mol %, greater than or equal to 10.5 mol %, greater than or equal to 11 mol %, greater than or equal to 11.5 mol %, greater than or equal to 12 mol %, greater than or equal to 12.5 mol %, greater than or equal to 13 mol %, or greater than or equal to 13.5 mol %.

In some embodiments, the glass composition may include $Li_2O$ in amounts less than or equal to 14 mol %, such as less than or equal to 14 mol %, less than or equal to 13.5 mol %, less than or equal to 13 mol %, less than or equal to 12.5 mol %, less than or equal to 12 mol %, less than or equal to 11.5 mol %, less than or equal to 11 mol %, less than or equal to 10.5 mol %, less than or equal to 10 mol %, less than or equal to 9.5 mol %, less than or equal to 9 mol %, or less than or equal to 8.5 mol %.

Any of the above ranges may be combined with any other range. For example, in some embodiments, the glass composition may include $Li_2O$ in an amount from greater than or equal to 8 mol % to less than or equal to 14 mol %, such as from greater than or equal to 8.5 mol % to less than or equal to 13.5 mol %, from greater than or equal to 9 mol % to less than or equal to 13 mol %, from greater than or equal to 9.5 mol % to less than or equal to 12.5 mol %, from greater than or equal to 10 mol % to less than or equal to 12 mol %, or from greater than or equal to 10.5 mol % to less than or equal to 11.5 mol %, and all ranges and sub-ranges between the foregoing values having any two of the above-listed $Li_2O$ values as endpoints, including the endpoints.

In some embodiments, the glass composition may also include alkali metal oxides other than $Li_2O$, such as $Na_2O$. $Na_2O$ may aid in the ion exchangeability of the glass composition, and improve the formability, and thereby manufacturability, of the glass composition. However, if too much $Na_2O$ is added to the glass composition, the CTE may be too low, and the melting point may be too high.

In some embodiments, the glass composition may include $Na_2O$ in an amount from greater than 0 mol % $Na_2O$ to less than or equal to 4 mol % $Na_2O$, and all ranges and sub-ranges between the foregoing values. For example, the glass composition may include $Na_2O$ in amounts greater than 0 mol %, such as greater than or equal to 0.5 mol %, greater than or equal to 1 mol %, greater than or equal to 1.5 mol %, greater than or equal to 2 mol %, greater than or equal to 2.5 mol %, greater than or equal to 3 mol %, or greater than or equal to 3.5 mol %.

In some embodiments, the glass composition may include $Na_2O$ in amounts less than or equal to 4 mol %, such as less than or equal to 4 mol %, less than or equal to 3.5 mol %, less than or equal to 3 mol %, less than or equal to 2.5 mol %, less than or equal to 2 mol %, or less than or equal to 1.5 mol %, less than or equal to 1 mol %, or less than or equal to 0.5 mol %. In some embodiments, the glass composition may include less than 3 mol % $Na_2O$.

Any of the above ranges may be combined with any other range. For example, in some embodiments, the glass composition may include $Na_2O$ in an amount from greater than 0 mol % to less than or equal to 4 mol %, such as from greater than or equal to 0.5 mol % to less than or equal to 3.5 mol %, from greater than or equal to 1 mol % to less than or equal to 3 mol %, or from greater than or equal to 1.5 mol % to less than or equal to 2.5 mol %, and all ranges and sub-ranges between the foregoing values having any two of the above-listed $Na_2O$ values as endpoints, including the endpoints. In some embodiments, the glass composition may include $Na_2O$ in a range of 0.1 mol % to 4 mol %.

In some embodiments, the glass composition may include $K_2O$. Like $Na_2O$, $K_2O$ promotes ion exchange and increases the DOC of a compressive stress layer. However, adding $K_2O$ may cause the CTE to be too low, and the melting point may be too high. In some embodiments, the glass composition may include $K_2O$. In some embodiments, the glass composition is substantially free of $K_2O$. In some embodiments, $K_2O$ may be present in the glass composition in amounts less than or equal to 1 mol %, for example, 0.1 mol % to 1 mol %.

As used herein, the term "substantially free" means that the component is not added as a component of the batch material even though the component may be present in the final glass in very small amounts as a contaminant. As a result of the raw materials and/or equipment used to produce a glass composition of the present disclosure, certain impurities or components that are not intentionally added, can be present in the final glass composition. Such materials are present in the glass composition in minor amounts, referred to "tramp materials." A composition that is "substantially free" of a component means that the component was not purposefully added to the composition, but the composition may still comprise the component in tramp or trace amounts. A composition that is "substantially free" of an oxide means that the oxide is present at an amount less than or equal to 0.1 mol %, for example 0 mol % to 0.1 mol %. As used herein, a glass composition that is "free" of a component, is defined as meaning that the component (e.g., oxide) is not present in the composition, even in tramp or trace amounts.

In some embodiments, the glass composition may include MgO. MgO may lower the viscosity of a glass, which enhances the formability and manufacturability of the glass. The inclusion if MgO in a glass composition may also improve the strain point and the Young's modulus of the glass composition as well as the ion exchange ability of the glass. However, if too much MgO is added to the glass composition, the density and the CTE of the glass composition may increase to undesirable levels.

In some embodiments, the glass composition may include MgO in a concentration of from greater than 0 mol % to less than or equal to 5 mol %, and all ranges and sub-ranges between the foregoing values. For example, the glass composition may include MgO in amounts greater than 0 mol %, such as greater than or equal to 0.5 mol %, greater than or equal to 1 mol %, greater than or equal to 1.5 mol %, greater than or equal to 2 mol %, greater than or equal to 2.5 mol %, greater than or equal to 3 mol %, greater than or equal to 3.5 mol %, greater than or equal to 4 mol %, or greater than or equal to 4.5 mol %.

In some embodiments, the glass composition may include MgO in amounts less than or equal to 5 mol %, such as less than or equal to 4.5 mol %, less than or equal to 4 mol %, less than or equal to 3.5 mol %, less than or equal to 3 mol %, less than or equal to 2.5 mol %, less than or equal to 2 mol %, less than or equal to 1.5 mol %, less than or equal to 1 mol %, or less than or equal to 0.5 mol %.

Any of the above ranges may be combined with any other range. For example, in some embodiments, the glass composition may include MgO in an amount from greater than 0 mol % to less than or equal to 5 mol %, such as from greater than or equal to 0.5 mol % to less than or equal to 4.5 mol %, from greater than or equal to 1 mol % to less than or equal to 4 mol %, from greater than or equal to 1.5 mol % to less than or equal to 3.5 mol %, or from greater than or equal to 2 mol % to less than or equal to 3 mol %, and all ranges and sub-ranges between the foregoing values having any two of the above-listed MgO values as endpoints, including the endpoints. In some embodiments, the glass composition may include MgO in a range of 0.1 mol % to 5 mol %.

In some embodiments, the glass composition may include CaO. CaO may lower the viscosity of a glass, which may enhance the formability, the strain point and the Young's modulus, and may improve the ion exchange ability. However, when too much CaO is added to the glass composition, the density and the CTE of the glass composition may increase. In some embodiments, the glass composition may include CaO in a concentration of from greater than 0 mol % to less than or equal to 2 mol %, and all ranges and sub-ranges between the foregoing values. For example, the glass composition may include CaO in amounts greater than 0 mol %, such as greater than or equal to 0.1 mol %, greater than or equal to 0.2 mol %, greater than or equal to 0.3 mol %, greater than or equal to 0.4 mol %, greater than or equal to 0.5 mol %, greater than or equal to 0.6 mol %, greater than or equal to 0.7 mol %, greater than or equal to 0.8 mol %, greater than or equal to 0.9 mol %, greater than or equal to 1 mol %, greater than or equal to 1.1 mol %, greater than or equal to 1.2 mol %, greater than or equal to 1.3 mol %, greater than or equal to 1.4 mol %, greater than or equal to 1.5 mol %, greater than or equal to 1.6 mol %, greater than or equal to 1.7 mol %, greater than or equal to 1.8 mol %, or greater than or equal to 1.9 mol %.

In some embodiments, the glass composition may include CaO in amounts less than or equal to 2 mol %, such as less than or equal to 1.9 mol %, less than or equal to 1.8 mol %, less than or equal to 1.7 mol %, less than or equal to 1.6 mol %, less than or equal to 1.5 mol %, less than or equal to 1.4 mol %, less than or equal to 1.3 mol %, less than or equal to 1.2 mol %, less than or equal to 1.1 mol %, less than or equal to 1 mol %, less than or equal to 0.9 mol %, less than or equal to 0.8 mol %, less than or equal to 0.7 mol %, less than or equal to 0.6 mol %, less than or equal to 0.5 mol %, less than or equal to 0.4 mol %, less than or equal to 0.3 mol %, less than or equal to 0.2 mol %, or less than or equal to 0.1 mol %. Any of the above ranges may be combined with any other range having any two of the above-listed CaO values as endpoints, including the endpoints. In some embodiments, the glass composition may include CaO in a range of 0.1 mol % to 2 mol %.

In some embodiments, the glass composition may be free or substantially free of one or more of: $La_2O_3$, $Y_2O_3$, $TiO_2$, or $ZrO_2$. As discussed above, these particular oxides may increase the fracture toughness of the glass composition. However, they are typically expensive and in limited supply. Accordingly, these oxides may be excluded from the composition. In some embodiments, the glass composition may include $TiO_2$ in a range of greater than 0 mol % to less than or equal to 2 mol %. In some embodiments, the glass composition may include $TiO_2$ in a range of 0.1 mol % to 2 mol %. In some embodiments, the glass composition may include $ZrO_2$ in a range of greater than 0 mol % to less than or equal to 2 mol %. In some embodiments, the glass composition may include $ZrO_2$ in a range of 0.1 mol % to 2 mol %.

In some embodiments, the glass composition may be substantially free or free of SrO. In some embodiments, the glass composition may also be substantially free or free of $P_2O_5$. The inclusion of $P_2O_5$ in the glass composition may undesirably reduce the meltability and formability of the glass composition, thereby impairing the manufacturability of the glass composition. Glass compositions intended for ion exchange strengthening may include $P_2O_5$ to enhance the speed of the ion exchange treatment, such as by decreasing the ion exchange treatment time required to produce a desired compressive stress or depth of compression. It is not necessary to include $P_2O_5$ in the glass compositions described herein to achieve the desired ion exchange performance. For this reason, $P_2O_5$ may be excluded from the glass composition to avoid negatively impacting the manufacturability of the glass composition while maintaining the desired ion exchange performance.

In some embodiments, the glass composition may optionally include one or more fining agents. In some embodiments, the fining agents may include, for example, $SnO_2$. In such embodiments, $SnO_2$ may be present in the glass composition in an amount less than or equal to 2 mol %, such as from greater than 0 mol % to less than or equal to 2 mol %, and all ranges and sub-ranges between the foregoing values. In other embodiments, $SnO_2$ may be present in the glass composition in an amount from greater than 0 mol % to less than or equal to 1.5 mol %, or greater than or equal to 0.5 mol % to less than or equal to 1 mol %, and all ranges and sub-ranges between the foregoing values. In some embodiments, the glass composition may be substantially free or free of $SnO_2$. In some embodiments, the composition may include $SnO_2$ in a range of 0 mol % to 2 mol %. In some embodiments, the composition may include $SnO_2$ in a range of 0.1 mol % to 2 mol %.

In some embodiments, the fining agents may include, for example $Fe_2O_3$. In such embodiments, $Fe_2O_3$ may be present in the glass composition in an amount less than or equal to 0.1 mol %, such as from greater than 0 mol % to less than or equal to 0.1 mol %. In some embodiments, the glass composition may be substantially free or free of $Fe_2O_3$.

In some embodiments, a relationship of $(Li_2O+Na_2O+K_2O+MgO+CaO+SrO)/A_2O_3$ may be from greater than or equal to 0.85 to less than 1, where each component concentration is in mol %. This relationship may ensure that the composition is peraluminous such that the $B_2O_3$ in the composition will be in the trigonal configuration. In some embodiments, the ratio of $(Li_2O+Na_2O+K_2O+MgO+CaO+SrO)/A_2O_3$ may be less than or equal to 1, less than or equal to 0.99, less than or equal to 0.98, less than or equal to 0.97, less than or equal to 0.96, less than or equal to 0.95, less than or equal to 0.94, less than or equal to 0.93, less than or equal to 0.92, less than or equal to 0.91, less than or equal to 0.90, less than or equal to 0.89, less than or equal to 0.88, less than or equal to 0.87, or less than or equal to 0.86.

In some embodiments, the ratio of $(Li_2O+Na_2O+K_2O+MgO+CaO+SrO)/Al_2O_3$ may be greater than or equal to 0.85, greater than or equal to 0.86, greater than or equal to 0.87, greater than or equal to 0.88, greater than or equal to 0.89, greater than or equal to 0.90, greater than or equal to 0.91, greater than or equal to 0.92, greater than or equal to 0.93, greater than or equal to 0.94, greater than or equal to 0.95, greater than or equal to 0.96, greater than or equal to 0.97, or greater than or equal to 0.98. Any of the above ranges may be combined for form a range having any two of the above-listed values as endpoints, including the endpoints.

In some embodiments, the ratio of $(Li_2O+Na_2O+K_2O+MgO+CaO+SrO)/A_2O_3$ may be from greater than or equal to 1.0 to less than or equal to 1.15, such as from greater than or equal to 1.01 to less than or equal to 1.14, from greater than or equal to 1.02 to less than or equal to 1.13, from greater than or equal to 1.03 to less than or equal to 1.12, from greater than or equal to 1.04 to less than or equal to 1.11, from greater than or equal to 1.05 to less than or equal to 1.10, from greater than or equal to 1.06 to less than or equal to 1.09, or from greater than or equal to 1.07 to less than or equal to 1.08. Any of the above ranges may be combined to form range having any two of the above-listed values as endpoints, including the endpoints. In such embodiments, the composition may not be peraluminous. However, the majority of the $B_2O_3$ will still remain in the trigonal configuration such that the fracture toughness of the glass composition is increased.

In some embodiments, the glass composition falls on or in a convex hull defined by the compositions of Tables 1, 2, and 3, shown below. The convex hull corresponds to the smallest convex boundary that contains a set of points in a space of a given dimension. The convex hull is in d dimensional space, where d is the number of different oxides listed in Tables 1, 2, and 3. For example, in some embodiments, d=14 and includes $SiO_2$, $Al_2O_3$, $P_2O_5$, $B_2O_3$, MgO, CaO, SrO, $Li_2O$, $Na_2$, $K_2O$, $TiO_2$, $SnO_2$, $Fe_2O_3$, and $ZrO_2$. The boundaries of the convex hull are defined by the maximum and minimum mol % values for each element across Tables 1, 2, and 3. The convex hull may be calculated using a dD Convex Hulls and Delaunay Triangulations algorithm authored by Susan Hert and Michael Seel in the Computation Geometry Algorithms Library (CGAL), User and Reference Manual, CGAL Editorial Board, 4.14 edition, 2019.

Physical properties of the glass compositions as disclosed above will now be discussed. These physical properties can be achieved by tailoring the component amounts of the glass composition, as will be discussed in more detail with reference to the examples.

Glass compositions according to some embodiments may have a fracture toughness of 0.75 $MPa*m^{1/2}$ or more. Without wishing to be bound by any particular theory, the high fracture toughness may impart improved drop performance to the glass compositions. Unless specified otherwise, the fracture toughness refers to the $K_{1C}$ value, and is measured by the chevron notched short bar method, and is reported in $MPa*m^{1/2}$ (megapascals times square root meter). The chevron notched short bar (CNSB) method utilized to measure the $K_{1C}$ value is disclosed in Reddy, K. P. R. et al, "Fracture Toughness Measurement of Glass and Ceramic Materials Using Chevron-Notched Specimens," J. Am. Ceram. Soc., 71 [6], C-310-C-313 (1988) except that Y*m is calculated using equation 5 of Bubsey, R. T. et al., "Closed-Form Expressions for Crack-Mouth Displacement and Stress Intensity Factors for Chevron-Notched Short Bar and Short Rod Specimens Based on Experimental Compliance Measurements," NASA Technical Memorandum 83796, pp. 1-30 (October 1992). Additionally, the $K_{1C}$ values are measured on non-strengthened glass articles, such as measuring the $K_{1C}$ value prior to ion exchanging a glass article, or measuring the $K_{1C}$ value of glass having the same composition that an ion-exchanged glass had prior to ion exchange. The composition of an ion exchanged glass prior to ion exchange may be determined by evaluating the composition at the center of the ion exchanged glass. Fracture toughness is evaluated on glass that is not ion exchanged because the measurement techniques do not work well on ion exchanged glass. But, fracture toughness still affects the attributes of a glass article. The measured value is considered a property of the ion exchanged glass, even though it is difficult to directly measure on the ion exchanged glass.

In some embodiments, the glass compositions exhibit a $K_{1C}$ value measured by the CNSB method of 0.75 or more, such as 0.76 or more, 0.77 or more, 0.78 or more, 0.79 or more, 0.80 or more, 0.81 or more, 0.82 or more, 0.83 or more, 0.84 or more, or 0.85 or more. In some embodiments, the glass composition may exhibit a $K_{1C}$ value measured by CNSB method from greater than or equal to 0.70 to less than or equal to 1, such as from greater than or equal to 0.71 to less than or equal to 0.99, from greater than or equal to 0.72 to less than or equal to 0.98, from greater than or equal to 0.73 to less than or equal to 0.97, from greater than or equal to 0.74 to less than or equal to 0.96, from greater than or equal to 0.75 to less than or equal to 0.95, from greater than or equal to 0.76 to less than or equal to 0.94, from greater than or equal to 0.77 to less than or equal to 0.93, from greater than or equal to 0.78 to less than or equal to 0.92, from greater than or equal to 0.79 to less than or equal to 0.91, from greater than or equal to 0.80 to less than or equal to 0.90, from greater than or equal to 0.81 to less than or equal to 0.89, from greater than or equal to 0.82 to less than or equal to 0.88, from greater than or equal to 0.83 to less than or equal to 0.87, or from greater than or equal to 0.84 to less than or equal to 0.86, and all ranges and sub-ranges between the foregoing values having any two of the above-listed $K_{1C}$ values as endpoints, including the endpoints. In some embodiments, a glass composition as described herein in the form of a glass-ceramic may exhibit a $K_{1C}$ value measured by CNSB in the range of 1 to 10, including subranges. For example, the $K_{1C}$ value may be from greater than or equal to 1 to less than or equal to 10, from greater than or equal to 2 to less than or equal to 9, from greater than or equal to 3 to less than or equal to 8, from greater than or equal to 4 to less than or equal to 7, or from greater than or equal to 5 to less than or equal to 6, and all ranges and sub-ranges between the foregoing values having any two of the above-listed $K_{1C}$ values as endpoints, including the endpoints.

In some embodiments, the liquidus viscosity of the composition is 1000 Poise or more, such as 1050 Poise or more, 1100 Poise or more, 1150 Poise or more, 1200 Poise or more, 1250 Poise or more, 1300 Poise or more, 1350 Poise or more, 1400 Poise or more, 1450 Poise or more, 1500 Poise or more, 1550 Poise or more, 1600 Poise or more, 1650 Poise or more, or up to 7000 Poise. In some embodiments, the liquidus viscosity of the composition is in a range of 1000 Poise to 7000 Poise, including subranges. For example, the liquidus viscosity of the composition may be from greater than or equal to 1000 Poise to less than or equal to 7000 Poise, from greater than or equal to 2000 Poise to less than or equal to 6000 Poise, or from greater than or equal to 3000 Poise to less than or equal to 5000 Poise, and all ranges and sub-ranges between the foregoing values having any two of the above-listed liquidus viscosity values as endpoints, including the endpoints. Unless specified otherwise, a liquidus viscosity value disclosed in this application is determined by the following method. First the liquidus temperature of the glass is measured in accordance with ASTM C829-81 (2015), titled "Standard Practice for Measurement of Liquidus Temperature of Glass by the Gradient Furnace Method." Next the viscosity of the glass at the liquidus temperature is measured in accordance with ASTM C965-96 (2012), titled "Standard Practice for Measuring Viscosity of Glass Above the Softening Point".

In some embodiments, the Young's modulus (E) of a glass composition may be from greater than or equal to 70 GPa to less than or equal to 90 gigapascals (GPa), such as from greater than or equal to 71 GPa to less than or equal to 89 GPa, from greater than or equal to 72 GPa to less than or equal to 88 GPa, from greater than or equal to 73 GPa to less than or equal to 87 GPa, from greater than or equal to 74 GPa to less than or equal to 86 GPa, from greater than or equal to 75 GPa to less than or equal to 85 GPa, from greater than or equal to 76 GPa to less than or equal to 84 GPa, from greater than or equal to 77 GPa to less than or equal to 83 GPa, from greater than or equal to 78 GPa to less than or equal to 82 GPa, or from greater than or equal to 79 GPa to less than or equal to 81 GPa, and all ranges and sub-ranges between the foregoing values having any two of the above-listed Young's modulus values as endpoints, including the endpoints. Unless specified otherwise, the Young's modulus values disclosed in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

According to some embodiments, the glass composition may have a shear modulus (G) of from greater than or equal to 30 GPa to less than or equal to 40 GPa, such as from greater than or equal to 31 GPa to less than or equal to 39 GPa, from greater than or equal to 32 GPa to less than or equal to 38 GPa, from greater than or equal to 33 GPa to less than or equal to 37 GPa, or from greater than or equal to 34 GPa to less than or equal to 36 GPa, and all ranges and sub-ranges between the foregoing values having any two of the above-listed shear modulus values as endpoints, including the endpoints. Unless specified otherwise, a shear modulus values disclosed in this application refers to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

According to some embodiments, the glass composition may have a Poisson's ratio (ν) of from greater than or equal to 0.20 to less than or equal to 0.25, such as from greater than or equal to 0.21 to less than or equal to 0.24, from greater than or equal to 0.22 to less than or equal to 0.23, and all ranges and sub-ranges between the foregoing values having any two of the above-listed values as endpoints, including the endpoints. Unless specified otherwise, a Poisson's ratio value disclosed in this application refers to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

From the above compositions, glass articles according to embodiments may be formed by any suitable method, such as slot forming, float forming, rolling processes, fusion forming processes, etc.

The glass composition and the articles produced therefrom may be characterized by the manner in which it may be formed. For instance, the glass composition may be characterized as float-formable (i.e., formable by a float process), down-drawable and, in particular, fusion-formable or slot-drawable (i.e., formed by a down draw process such as a fusion draw process or a slot draw process).

Some embodiments of the glass articles described herein may be formed by a down-draw process. Down-draw processes produce glass articles having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the glass articles may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass articles described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

Drawing processes for forming glass articles, such as, for example, glass sheets, are desirable because they allow a thin glass article to be formed with few defects. It was previously thought that glass compositions were required to have relatively high liquidus viscosities—such as a liquidus viscosity greater than 1000 kP, greater than 1100 kP, or greater than 1200 kP—to be formed by a drawing process, such as, for example, fusion drawing or slot drawing. However, developments in drawing processes may allow glasses with lower liquidus viscosities to be used in drawing processes.

In one or more embodiments, the glass articles described herein may exhibit an amorphous microstructure and may be substantially free of crystals or crystallites. In other words, the glass articles exclude glass-ceramic materials in some embodiments. In some embodiments, the glass articles described herein may include glass-ceramic materials.

As mentioned above, in some embodiments, the glass compositions can be strengthened, such as by ion exchange. With reference to FIG. 1, glass article 100 may have one or more regions under compressive stress (e.g., first and second compressive stress regions 120, 122) extending from exterior surfaces of glass article 100 (e.g., surfaces 110, 112) to a depth of compression (DOC, d1, d2) and a second region (e.g., central region 130) under a tensile stress or CT extending from the DOC into the central or interior region of glass article 100. As used herein, DOC refers to the depth at which the stress within the glass article changes from compressive to tensile. At the DOC, the stress crosses from a positive (compressive) stress to a negative (tensile) stress and thus exhibits a stress value of zero. Ion-exchanged compressive stress regions 120, 122 have a concentration of a metal oxide that is different at two or more points through a thickness of glass article 100. In some embodiments, glass article 100 may not include first compressive region 120 and/or second compressive stress region 122.

Sometimes in the art, but not in this disclosure, compression or compressive stress (CS) is expressed as a negative (<0) stress and tension or tensile stress is expressed as a positive (>0) stress. Throughout this description, however, "stress" is expressed as positive for compressive stress and negative for tensile stress. CS refers to a compressive stress, and has a positive value. Tensile stress can be expressed in two ways—as a negative value for "stress", and as a positive value for CT. So, a region under tensile stress with an absolute value of 100 MPa may be referred to as having a CT of 100 MPa and a stress of −100 MPa.

In some embodiments, the CS has a maximum at the surface of the glass, and the CS varies with distance d from the surface according to a function. Referring again to FIG. 1, a first compressive stress region 120 extends from first surface 110 to a depth $d_1$ and a second compressive stress region 122 extends from second surface 112 to a depth $d_2$. Together, these segments define a compression or CS of glass article 100. Unless specified otherwise, compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. Unless specified otherwise, SOC is measured according to Procedure C (Glass Disc Method) described in ASTM standard C770-16, entitled "Standard Test Method for Measurement of Glass Stress-Optical Coefficient," the contents of which are incorporated herein by reference in their entirety.

In some embodiments, the CS of one or more compressive stress regions of the glass article is from greater than or equal to 400 MPa to less than or equal to 800 MPa, such as from greater than or equal to 425 MPa to less than or equal to 775 MPa, from greater than or equal to 450 MPa to less than or equal to 750 MPa, from greater than or equal to 475 MPa to less than or equal to 725 MPa, from greater than or equal to 500 MPa to less than or equal to 700 MPa, from greater than or equal to 525 MPa to less than or equal to 675 MPa, from greater than or equal to 550 MPa to less than or equal to 650 MPa, or from greater than or equal to 575 MPa to less than or equal to 625 MPa, and all ranges and sub-ranges between the foregoing values having any two of the above-listed values as endpoints, including the endpoints. Where a lower endpoint for stress is not specified, a stress "less than" a particular value may be as low as 1 MPa or lower. Where an upper endpoint for stress is not specified, a stress "greater than" a particular value may be as high as 775 MPa, 1000 MPa, 2000 MPa or higher.

For example, in one or more embodiments, Na+ and K+ ions are exchanged into the glass article and the Na+ ions diffuse to a deeper depth into the glass article than the K+ ions. The depth of penetration of K+ ions ("Potassium DOL") is distinguished from DOC because it represents the depth of potassium penetration as a result of an ion exchange process. The Potassium DOL is typically less than the DOC for the articles described herein. Unless specified otherwise, potassium DOL is measured using a surface stress meter such as the commercially available FSM-6000 surface stress meter, manufactured by Orihara Industrial Co., Ltd. (Japan), which relies on accurate measurement of the stress optical coefficient (SOC), as described above with reference to the CS measurement. The Potassium DOL of each of first and second compressive stress regions 120, 122 may be from greater than or equal to 5 μm to less than or equal to 15 μm, such as from greater than or equal to 6 μm to less than or equal to 14 μm, from greater than or equal to 7 μm to less than or equal to 13 μm, from greater than or equal to 8 μm to less than or equal to 12 μm, or from greater than or equal to 9 μm to less than or equal to 11 μm, and all ranges and sub-ranges between the foregoing values having any two of the above-listed values as endpoints, including the endpoints.

The compressive stress of both regions 120 and 122 is balanced by stored tension in the central region 130 of glass article 100. Unless specified otherwise, maximum CT and DOC values disclosed in this application are measured using a scattered light polariscope (SCALP) technique known in the art. The Refracted near-field (RNF) method or SCALP may be used to measure the stress profile. When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of between 1 Hz and 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

A SCALP measurement is performed using SCALP polariscope (e.g., SCALP-04 or SCALP-05), available from GlassStress Ltd., Talinn, Estonia. The precise sample speed SS and exposure times $t_E$ needed to reduce the measurement noise in the polarimeter to an acceptable level when measuring a sample to characterize at least one stress-related characteristic depends on a number of factors. These factors include the characteristics of the image sensing device (e.g., the gain, image capture rate (frames/second), pixel size, internal pixel average techniques, etc.), as well as the nature of the no-stress-related (NSR) scattering feature(s), the intensity of the input light beam, the number of polarization states used, etc. Other factors include the measurement wavelength of the light beam from the laser source and the intensity of the scattered light beam. Example measurement wavelengths can include 640 nm, 518 nm and 405 nm. Example exposure times can range from 0.05 millisecond to 100 milliseconds. Example frame rates can range between 10 and 200 frames per second. Example calculations of the optical retardation can utilize between two and two-hundred frames over a measurement time $t_M$ of between 0.1 seconds and 10 seconds.

In some embodiments, the glass article may have a maximum CT greater than or equal to 35 MPa, such as greater than or equal to 40 MPa, greater than or equal to 50 MPa, greater than or equal to 60 MPa, greater than or equal to 70 MPa, greater than or equal to 80 MPa, greater than or equal to 90 MPa, greater than or equal to 100 MPa, or greater than or equal to 110 MPa. In some embodiments, the glass article may have a maximum CT less than or equal to 110 MPa, such as less than or equal to 100 MPa, less than or equal to 90 MPa, less than or equal to 80 MPa, less than or equal to 70 MPa, less than or equal to 60 MPa, less than or equal to 50 MPa, or less than or equal to 40 MPa, and all ranges and sub-ranges between the foregoing values. It should be understood that, in some embodiments, any of the above ranges may be combined with any other range. However, in other embodiments, the glass article may have a maximum CT from greater than or equal to 35 MPa to less than or equal to 110 MPa, such as from greater than or equal to 40 MPa to less than or equal to 100 MPa, from greater than or equal to 50 MPa to less than or equal to 90 MPa, or from greater than or equal to 60 MPa to less than or equal to 80 MPa. Any of the above ranges may be combined to form range having any two of the above-listed CT values as endpoints, including the endpoints.

As noted above, DOC is measured using a scattered light polariscope (SCALP) technique known in the art. The DOC is provided in some embodiments herein as a portion of the thickness (t) of the glass article 100. In embodiments, glass articles may have a depth of compression (DOC) from greater than or equal to 0.15 t to less than or equal to 0.25 t, such as from greater than or equal to 0.18 t to less than or equal to 0.22 t, or from greater than or equal to 0.19 t to less than or equal to 0.21 t. In some embodiments, glass articles may have a DOC from greater than or equal to 0.16 to less than or equal to 0.2 t, such as from greater than or equal to 0.17 t to less than or equal to 0.25 t, from greater than or equal to 0.18 t to less than or equal to 0.25 t, from greater than or equal to 0.19 t to less than or equal to 0.25 t, from greater than or equal to 0.20 t to less than or equal to 0.25 t, from greater than or equal to 0.21 t to less than or equal to 0.25 t, from greater than or equal to 0.22 t to less than or equal to 0.25 t, from greater than or equal to 0.23 t to less than or equal to 0.25 t, or from greater than or equal to 0.24 t to less than or equal to 0.25 t. In yet other embodiments, glass articles may have a DOC from greater than or equal to 0.15 t to less than or equal to 0.24 t, such as from greater than or equal to 0.15 t to less than or equal to 0.23 t, from greater than or equal to 0.15 t to less than or equal to 0.22 t, from greater than or equal to 0.15 t to less than or equal to 0.21 t, from greater than or equal to 0.15 t to less than or equal to 0.20 t, from greater than or equal to 0.15 t to less than or equal to 0.19 t, from greater than or equal to 0.15 t to less than or equal to 0.18 t, from greater than or equal to 0.15 t to less than or equal to 0.17 t, or from greater than or equal to 0.15 t to less than or equal to 0.16 t. In some embodiments, glass articles may have a DOC of 0.20 t or more. In some embodiments, glass articles may have a DOC of 0.15 t or more.

Compressive stress layers may be formed in the glass by exposing the glass to an ion exchange solution. In some embodiments, the ion exchange solution may be molten nitrate salt. In some embodiments, the ion exchange solution may be molten $KNO_3$, molten $NaNO_3$, or combinations thereof. In certain embodiments, the ion exchange solution may comprise less than about 95% molten $KNO_3$, such as less than about 90% molten $KNO_3$, less than about 80% molten $KNO_3$, less than about 70% molten $KNO_3$, less than about 60% molten $KNO_3$, or less than about 50% molten $KNO_3$. In certain embodiments, the ion exchange solution may comprise about 5% or more molten $NaNO_3$, such as about 10% or more molten $NaNO_3$, about 20% or more molten $NaNO_3$, about 30% or more molten $NaNO_3$, or about 40% or more molten $NaNO_3$. In other embodiments, the ion exchange solution may comprise about 95% molten $KNO_3$ and about 5% molten $NaNO_3$, about 94% molten $KNO_3$ and about 6% molten $NaNO_3$, about 93% molten $KNO_3$ and about 7% molten $NaNO_3$, about 80% molten $KNO_3$ and about 20% molten $NaNO_3$, about 75% molten $KNO_3$ and about 25% molten $NaNO_3$, about 70% molten $KNO_3$ and about 30% molten $NaNO_3$, about 65% molten $KNO_3$ and about 35% molten $NaNO_3$, or about 60% molten $KNO_3$ and about 40% molten $NaNO_3$, and all ranges and sub-ranges between the foregoing values. In some embodiments, other sodium and potassium salts may be used in the ion exchange solution, such as, for example sodium or potassium nitrites, phosphates, or sulfates. In some embodiments, the ion exchange solution may include lithium salts, such as $LiNO_3$.

The glass composition may be exposed to the ion exchange solution by dipping a glass article made from the glass composition into a bath of the ion exchange solution, spraying the ion exchange solution onto a glass article made from the glass composition, or otherwise physically applying the ion exchange solution to a glass article made from the glass composition. Upon exposure to the glass composition, the ion exchange solution may, according to embodiments, be at a temperature from greater than or equal to 400° C. to less than or equal to 500° C., such as from greater than or equal to 410° C. to less than or equal to 490° C., from greater than or equal to 420° C. to less than or equal to 480° C., from greater than or equal to 430° C. to less than or equal to 470° C., or from greater than or equal to 440° C. to less than or equal to 460° C., and all ranges and sub-ranges between the foregoing values and having any two of the above-listed temperature values as endpoints, including the endpoints. In some embodiments, the temperature of the ion exchange solution may be 450° C.

In some embodiments, the glass composition may be exposed to the ion exchange solution for a duration from greater than or equal to 4 hours to less than or equal to 24 hours, such as from greater than or equal to 8 hours to less than or equal to 20 hours, or from greater than or equal to 12 hours to less than or equal to 16 hours, and all ranges and sub-ranges between the foregoing values and having any two of the above-listed time values as endpoints, including the endpoints.

The ion exchange process may be performed in an ion exchange solution under processing conditions that provide an improved compressive stress profile as disclosed, for example, in U.S. Patent Application Publication No. 2016/0102011, which is incorporated herein by reference in its entirety. In some embodiments, the ion exchange process may be selected to form a parabolic stress profile in the glass articles, such as those stress profiles described in U.S. Patent Application Publication No. 2016/0102014, which is incorporated herein by reference in its entirety.

After an ion exchange process is performed, it should be understood that a composition at the surface of a glass article may be different than the composition of the as-formed glass article (i.e., the glass article before it undergoes an ion exchange process). This results from one type of alkali metal ion in the as-formed glass, such as, for example Li+ or Na+, being replaced with larger alkali metal ions, such as, for example Na+ or K+, respectively. However, the glass composition at or near the center of the depth of the glass article will, in some embodiments, still have the composition of the as-formed glass article. Unless specified otherwise, glass compositions disclosed in this application are compositions of the glass article near the center of the depth of the article where the composition is unaffected by an ion exchange process, i.e., the composition of the as-formed glass article.

In some embodiments, the weight of the glass article increases due to the presence of the larger alkali metal ions in the composition, for example Na+ or K+. In some embodiments, the percent weight gain of the glass article is from greater than or equal to 0.4% to less than or equal to 1.2%, such as from greater than or equal to 0.5% to less than or equal to 1.1%, from greater than or equal to 0.6% to less than or equal to 1%, or from greater than or equal to 0.7% to less than or equal to 0.9%, an all ranges and sub-ranges between the foregoing values and having any two of the above-listed weight gain values as endpoints, including the endpoints.

The glass articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 2A and 2B. Specifically, FIGS. 2A and 2B show a consumer electronic product 200 including a housing 202 having a front surface 204, a back surface 206, and side surfaces 208. Electrical components that are at least partially inside or entirely within the housing include at least a controller 220, a memory 222, and a display 210 at or adjacent to front surface 406 of housing 202. Display 210 may be, for example, a light emitting diode (LED) display or an organic light emitting diode (OLED) display.

A cover substrate 212 may be disposed at or over front surface 204 of housing 202 such that it is disposed over display 210. Cover substrate 212 may include any of the glass articles disclosed herein and may be referred to as a "cover glass." Cover substrate 212 may serve to protect display 210 and other components of consumer electronic product 200 (e.g., controller 220 and memory 222) from damage. In some embodiments, cover substrate 212 may be bonded to display 210 with an adhesive. In some embodiments, cover substrate 212 may define all or a portion of front surface 204 of housing 202. In some embodiments, cover substrate 212 may define front surface 204 of housing 202 and all or a portion of side surfaces 208 of housing 202. In some embodiments, consumer electronic product 200 may include a cover substrate defining all or a portion of back surface 206 of housing 202.

EXAMPLES

Embodiments will be further clarified by the following examples. It should be understood that these examples are not limiting to the embodiments described above.

Glass compositions having components listed in Tables 1-3 below were prepared by conventional glass forming methods. In Tables 1-3, all components are in mol %, and the $K_{1C}$ (MPa*m$^{1/2}$), the Poisson's Ratio ($v$), the Young's modulus (E), and the shear modulus (G) of the glass compositions were measured according to the methods disclosed in this specification.

Tables 4-6 include the ion exchange conditions and properties for each of samples 1-18, shown in Tables 1-3. In Tables 1-3, "VFT" stands for the Vogel-Fulcher-Tammann equation, "HTV" stands for "high temperature viscosity curve," "BBV" stands for "beam bending viscometry, and "PPV" stands for "parallel plate viscometry." "Pt" denotes the liquidus temperature at the glass and platinum interface. The liquidus temperature of the glass compositions were measured according to ASTM C829 ("Standard Practices for Measuring of Liquidus Temperature of Glass by the Gradient Furnace Method"). Strain point, annealing point, and soft point were measured according to ASTM C598-93 ("Standard Test Method for Annealing Point and Strain Point of Glass by Beam Bending"). The refractive index (RI) at 589.3 nanometers values reported in Table 1 were measured using the following method. The index of refraction measurements were performed at the sodium D wavelength (589.3 nm) using a Bausch & Lomb Low Range Precision Refractometer with sodium arc lamp. The Bausch & Lomb Precision Refractometer measures the refractive index of a material by measuring the critical angle. The instruments used were calibrated periodically according to ASTM recommended procedures using absolute physical standards, or standards traceable to the National Institute of Standards and Technology (NIST).

TABLE 1

| Composition Sample Number: | 1 | 2 | 3 | 4 | 5 | 6 |
|---|---|---|---|---|---|---|
| $SiO_2$ | 56.99 | 58.19 | 58.14 | 56.57 | 58.29 | 58.17 |
| $Al2O_3$ | 17.46 | 16.89 | 17.27 | 17.73 | 15.86 | 17.90 |
| $P_2O_5$ | 0.00 | 0.00 | 0.00 | 0.00 | 0.00 | 0.00 |
| $B_2O_3$ (ICP) | 8.22 | 8.16 | 8.17 | 8.12 | 8.15 | 8.14 |
| MgO | 4.24 | 3.35 | 3.61 | 4.28 | 4.32 | 2.38 |
| CaO | 0.61 | 0.62 | 0.62 | 0.62 | 0.62 | 0.62 |
| SrO | 0.00 | 0.00 | 0.00 | 0.00 | 0.00 | 0.00 |
| $Li_2O$ | 10.55 | 10.82 | 10.21 | 10.72 | 10.78 | 10.82 |
| $Na_2O$ | 1.67 | 1.71 | 1.72 | 1.71 | 1.72 | 1.71 |
| $K_2O$ | 0.19 | 0.19 | 0.19 | 0.19 | 0.19 | 0.19 |
| $TiO_2$ | 0.01 | 0.01 | 0.01 | 0.01 | 0.01 | 0.01 |
| $SnO_2$ | 0.06 | 0.05 | 0.05 | 0.05 | 0.05 | 0.05 |
| $Fe_2O_3$ | 0.01 | 0.01 | 0.01 | 0.01 | 0.01 | 0.01 |
| $ZrO_2$ | 0.00 | 0.00 | 0.00 | 0.00 | 0.00 | 0.00 |
| Sum | 100.00 | 100.00 | 100.00 | 100.00 | 100.00 | 100.00 |
| $R_2O + R'O$ | 14.26 | 16.69 | 16.35 | 17.52 | 17.63 | 15.72 |
| $Al_2O_3 - (R_2O + R'O)$ | 0.20 | 0.20 | 0.92 | 0.21 | −1.77 | 2.18 |
| $Al_2O_3 + B_2O_3$ | 25.68 | 25.05 | 25.44 | 25.85 | 24.01 | 26.04 |
| Strain Point (BBV) ($10 \wedge 14.68$ P) | 550.8 | 543.7 | 551.8 | 553.0 | 533.9 | 553.9 |
| Annealing Point (BBV) ($10 \wedge 13.18$ P) | 595.4 | 588.8 | 597.2 | 597.2 | 577.4 | 599.5 |
| Soft Point (PPV) ($10 \wedge 7.6$ P) | 798.3 | 795.5 | 803.9 | 793.9 | 773.6 | 808.9 |
| Young's modulus (GPa) | 80.7 | 79.5 | 80.0 | 81.4 | 79.8 | 79.6 |
| Shear Modulus (GPa) | 32.6 | 32.2 | 32.3 | 32.8 | 32.3 | 32.1 |
| Poisson's Ratio | 0.238 | 0.235 | 0.236 | 0.242 | 0.237 | 0.237 |
| RI @ 589.3 | 1.5215 | 1.5193 | 1.5198 | 1.5231 | 1.5197 | 1.5193 |
| SOC (546.1 nm) Single PT | 3.082 | 3.094 | 3.097 | 3.050 | 3.081 | 3.134 |
| VFT parameters from HTV | | | | | | |
| A | −2.562 | −2.503 | −2.419 | −2.487 | −2.501 | −2.515 |
| B | 5602.8 | 5790.7 | 5506.2 | 5418.0 | 5738.1 | 5692.7 |
| $T_o$ | 244.4 | 223.3 | 257.0 | 256.8 | 211.2 | 251.4 |
| Liquidus (Gradient Boat) Duration (Hours) | 72 | 72 | 72 | 72 | 72 | 72 |
| Air (° C.) | 1235 | 1165 | 1250 | 1245 | 1185 | 1275 |
| Internal (° C.) | 1210 | 1160 | 1190 | 1225 | 1175 | 1270 |
| Pt (° C.) | 1205 | — | 1215 | 1225 | 1140 | — |
| Primary Phase | Corundum | Spodumene | Corundum | Corundum | Spodumene | Corundum |
| Secondary Phase | Mullite | Corundum | Mullite | Mullite | — | Mullite |
| Tertiary Phase | — | — | — | — | — | — |
| Liquidus Viscosity (Internal) (Poise) | 1739 | 4776 | 3038 | 1285 | 2835 | 1185 |

TABLE 1-continued

| Composition Sample Number: | 1 | 2 | 3 | 4 | 5 | 6 |
|---|---|---|---|---|---|---|
| Fracture Toughness ($K_{1C}$) (MPa * m$^{1/2}$) | 0.797 | 0.812 | 0.838 | 0.837 | 0.791 | 0.828 |

TABLE 2

| Composition Sample Number: | 7 | 8 | 9 | 10 | 11 | 12 |
|---|---|---|---|---|---|---|
| $SiO_2$ | 56.14 | 58.46 | 58.58 | 56.51 | 57.56 | 55.57 |
| $Al_2O_3$ | 16.92 | 15.77 | 16.79 | 16.74 | 16.79 | 16.80 |
| $P_2O_5$ | 0.00 | 0.00 | 0.00 | 0.00 | 0.00 | 0.00 |
| $B_2O_3$ (ICP) | 10.00 | 10.04 | 9.90 | 10.08 | 9.94 | 9.98 |
| MgO | 4.06 | 2.35 | 1.39 | 3.33 | 2.36 | 4.30 |
| CaO | 0.61 | 0.61 | 0.61 | 0.61 | 0.61 | 0.62 |
| SrO | 0.00 | 0.00 | 0.00 | 0.00 | 0.00 | 0.00 |
| $Li_2O$ | 10.33 | 10.79 | 10.75 | 10.73 | 10.75 | 10.74 |
| $Na_2O$ | 1.68 | 1.73 | 1.74 | 1.74 | 1.74 | 1.74 |
| $K_2O$ | 0.19 | 0.19 | 0.20 | 0.19 | 0.19 | 0.20 |
| $TiO_2$ | 0.00 | 0.00 | 0.00 | 0.00 | 0.00 | 0.00 |
| $SnO_2$ | 0.05 | 0.05 | 0.05 | 0.05 | 0.05 | 0.05 |
| $Fe_2O_3$ | 0.01 | 0.01 | 0.01 | 0.01 | 0.01 | 0.01 |
| $ZrO_2$ | 0.00 | 0.00 | 0.00 | 0.00 | 0.00 | 0.00 |
| Sum | 100.00 | 100.00 | 100.00 | 100.00 | 100.00 | 100.00 |
| $R_2O$ + R'O | 16.87 | 15.67 | 14.69 | 16.60 | 16.65 | 17.6 |
| $Al_2O_3$ − ($R_2O$ + R'O) | 0.05 | 0.10 | 2.10 | 0.14 | 1.14 | −0.80 |
| $Al_2O_3$ + $B_2O_3$ | 26.92 | 25.81 | 26.69 | 26.82 | 26.73 | 26.78 |
| Strain PT (BBV) (10 ^ 14.68 P) | 538.0 | 528.3 | 537.8 | 534.3 | 538.0 | 533.3 |
| Annealing PT (BBV) (10 ^ 13.18 P) | 582.2 | 572.9 | 584.0 | 578.4 | 582.7 | 575.9 |
| Soft PT (PPV) (10 ^ 7.6 P) | 781.4 | 780.1 | 793.7 | 777.9 | 786.3 | 771.6 |
| Young's Modulus (GPa) | 78.9 | 76.4 | 76.2 | 78.1 | 76.9 | 79.0 |
| Shear Modulus (GPa) | 31.8 | 30.8 | 30.8 | 31.5 | 31.1 | 31.9 |
| Poisson's Ratio | 0.243 | 0.239 | 0.239 | 0.238 | 0.236 | 0.239 |
| RI @ 589.3 | 1.5204 | 1.5155 | 1.5151 | 1.5191 | 1.5169 | 1.5209 |
| SOC (546.1 nm) Single PT | 3.114 | 3.219 | 3.222 | 3.144 | 3.194 | 3.116 |
| VFT parameters from HTV | | | | | | |
| A | −2.323 | −2.470 | −2.591 | −2.513 | −2.394 | −2.283 |
| B | 5142.0 | 5779.4 | 5926.5 | 5524.8 | 5498.2 | 5136.6 |
| $T_o$ | 264.4 | 203.0 | 212.4 | 227.4 | 239.9 | 252.7 |
| Liquidus (Gradient Boat) Duration (Hours) | 72 | 72 | 72 | 72 | 72 | 72 |
| Air (° C.) | 1185 | 1160 | 1235 | 1165 | 1175 | 1155 |
| Internal (° C.) | 1150 | 1140 | 1230 | 1145 | 1155 | 1140 |
| Pt (° C.) | 1145 | 1120 | 1240 | 1135 | 1155 | 1100 |
| Primary Phase | Corundum | Spodumene | Mullite | Corundum | Mullite | Spodumene |
| Secondary Phase | Mullite | — | Corundum | Mullite | — | — |
| Tertiary Phase | — | — | — | Spodumene | — | — |
| Liquidus Viscosity (Internal) (Poise) | 3043 | 4989 | 1710 | 3221 | 4114 | 3192 |
| Fracture Toughness ($K_{1C}$) (MPa * m$^{1/2}$) | 0.845 | 0.852 | 0.804 | 0.808 | 0.794 | 0.802 |

TABLE 3

| Composition Sample Number: | 13 | 14 | 15 | 16 | 17 | 18 |
|---|---|---|---|---|---|---|
| $SiO_2$ | 55.02 | 56.63 | 54.71 | 53.74 | 56.48 | 55.62 |
| $Al_2O_3$ | 16.62 | 15.83 | 16.84 | 17.32 | 16.87 | 16.72 |
| $P_2O_5$ | 0.00 | 0.00 | 0.00 | 0.00 | 0.00 | 0.00 |
| $B_2O_3$ (ICP) | 11.94 | 11.91 | 11.93 | 11.96 | 12.00 | 11.99 |
| MgO | 3.97 | 2.35 | 3.32 | 3.82 | 1.39 | 3.31 |
| CaO | 0.57 | 0.61 | 0.61 | 0.62 | 0.61 | 0.61 |
| SrO | 0.00 | 0.00 | 0.00 | 0.00 | 0.00 | 0.00 |
| $Li_2O$ | 10.01 | 10.69 | 10.63 | 10.59 | 10.69 | 9.79 |
| $Na_2O$ | 1.61 | 1.72 | 1.71 | 1.69 | 1.71 | 1.71 |
| $K_2O$ | 0.19 | 0.19 | 0.19 | 0.19 | 0.19 | 0.19 |
| $TiO_2$ | 0.01 | 0.01 | 0.01 | 0.00 | 0.01 | 0.01 |
| $SnO_2$ | 0.05 | 0.05 | 0.05 | 0.05 | 0.05 | 0.05 |
| $Fe_2O_3$ | 0.01 | 0.01 | 0.01 | 0.01 | 0.01 | 0.01 |
| $ZrO_2$ | 0.00 | 0.00 | 0.00 | 0.00 | 0.00 | 0.00 |
| Sum | 100.00 | 100.00 | 100.00 | 100.00 | 100.00 | 100.00 |
| $R_2O + R'O$ | 16.35 | 15.56 | 16.46 | 16.91 | 14.59 | 15.61 |
| $Al_2O_3 - (R_2O + R'O)$ | 0.27 | 0.27 | 0.38 | 0.41 | 2.28 | 1.11 |
| $Al_2O_3 + B_2O_3$ | 28.56 | 27.74 | 28.77 | 29.28 | 28.87 | 28.71 |
| Strain PT (BBV) ($10^{14.68}$ P) | 524.6 | 517.8 | 523.7 | 523.9 | 524.9 | 531.4 |
| Annealing PT (BBV) ($10^{13.18}$ P) | 568.5 | 561.6 | 567.1 | 567.4 | 569.7 | 575.9 |
| Soft PT (PPV) ($10^{7.6}$ P) | 766.4 | 760.8 | 759.3 | 763.7 | 776.0 | 774.1 |
| Young's Modulus (GPa) | 76.6 | 74.5 | 76.5 | 77.1 | 74.4 | 75.9 |
| Shear Modulus (GPa) | 31.0 | 30.3 | 30.9 | 31.2 | 30.1 | 30.8 |
| Poisson's Ratio | 0.236 | 0.232 | 0.239 | 0.235 | 0.233 | 0.233 |
| RI @ 589.3 | 1.5191 | 1.5152 | 1.5190 | 1.5206 | 1.5151 | 1.5175 |
| SOC (546.1 nm) single PT | 3.210 | 3.260 | 3.187 | 3.176 | 3.296 | 3.233 |
| VFT parameters from HTV | | | | | | |
| A | −2.335 | −2.453 | −2.360 | −2.146 | −2.620 | −2.044 |
| B | 5173.1 | 5615.7 | 5200.1 | 4669.3 | 5898.3 | 4656.9 |
| $T_o$ | 244.5 | 202.2 | 238.5 | 284.6 | 195.1 | 300.3 |
| Liquidus (Gradient Boat) Duration (Hours) | 72 | 72 | 72 | 72 | 72 | 72 |
| Air (° C.) | 1135 | 1115 | 1110 | 1175 | 1210 | 1210 |
| Internal (° C.) | 1125 | 1095 | 1100 | 1140 | 1195 | 1180 |
| Pt (° C.) | 1125 | 1075 | 1100 | 1140 | 1195 | 1185 |
| Primary Phase | Mullite | Spodumene | Mullite | Corundum | Mullite | Mullite |
| Secondary Phase | Corundum | — | Corundum | — | — | — |
| Tertiary Phase | — | — | — | — | — | — |
| Liquidus Viscosity (Internal) (Poise) | 3469 | 6870 | 4744 | 2054 | 1901 | 1777 |
| Fracture Toughness ($K_{1C}$) (MPa * $m^{1/2}$) | 0.783 | 0.777 | 0.816 | 0.816 | 0.798 | 0.840 |

TABLE 4

| Composition Sample Number: | 1 | 2 | 3 | 4 | 5 | 6 |
|---|---|---|---|---|---|---|
| IOX Temp. (° C.) | 450 | 450 | 450 | 450 | 450 | 450 |
| IOX Time (Hours) | 8 | 8 | 8 | 8 | 8 | 8 |
| Bath Composition | 93 $KNO_3$/7 | 93 $KNO_3$/7 | 93 $KNO_3$/7 | 93 $KNO_3$/7 | 93 $KNO_3$/7 | 93 $KNO_3$/7 |
| (%) | $NaNO_3$ | $NaNO_3$ | $NaNO_3$ | $NaNO_3$ | $NaNO_3$ | $NaNO_3$ |
| CS (MPa) | 672 | 645 | 659 | 696 | 628 | 656 |
| DOL (μm) | 7.2 | 8.7 | 8.5 | 6.8 | 8.7 | 8.5 |
| CT (MPa) | 89.2 | 85.2 | 91.3 | 95.5 | 69.5 | — |
| Wt. Gain (%) | 0.83% | 0.82% | 0.83% | 0.87% | 0.75% | 0.89% |

TABLE 4-continued

| Composition Sample Number: | 1 | 2 | 3 | 4 | 5 | 6 |
|---|---|---|---|---|---|---|
| IOX Temp. (° C.) | 450 | 450 | 450 | 450 | 450 | 450 |
| IOX Time (Hours) | 12 | 12 | 12 | 12 | 12 | 12 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 639 | 604 | 626 | 648 | 589 | 616 |
| DOL (μm) | 8.5 | 10.4 | 9.3 | 9.1 | 10.2 | 10.1 |
| CT (MPa) | 98.5 | 84.6 | 97.2 | 107.3 | 76.6 | — |
| Wt. Gain (%) | 0.96% | 0.94% | 0.97% | 1.01% | 0.87% | 1.06% |
| IOX Temp. (° C.) | 450 | 450 | 450 | 450 | 450 | 450 |
| IOX Time (Hours) | 16 | 16 | 16 | 16 | 16 | 16 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 603 | 575 | 599 | 624 | 537 | 594 |
| DOL (μm) | 10.0 | 12.6 | 11.3 | 9.6 | 12.4 | 11.8 |
| CT (MPa) | 100.3 | 85.2 | 94.4 | 106.7 | 74.1 | — |
| Wt. Gain (%) | 1.07% | 1.06% | 1.10% | 1.13% | 0.95% | 1.16% |

TABLE 5

| Composition Sample Number: | 7 | 8 | 9 | 10 | 11 | 12 |
|---|---|---|---|---|---|---|
| IOX Temp (° C.) | 450 | 450 | 450 | 450 | 450 | 450 |
| IOX Time (Hours) | 4 | 4 | 4 | 4 | 4 | 4 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | — | 625 | 643 | 718 | 671 | — |
| DOL (μm) | — | 7.1 | 6.8 | 5.8 | 6.4 | — |
| CT (MPa) | 45.6 | 45.1 | 50.8 | 47.5 | 51.2 | 51.2 |
| Wt. Gain (%) | 0.51% | 0.54% | 0.57% | 0.51% | 0.57% | 0.56% |
| IOX Temp. (° C.) | 450 | 450 | 450 | 450 | 450 | 450 |
| IOX Time (Hours) | 8 | 8 | 8 | 8 | 8 | 8 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 654 | 561 | 580 | 620 | 591 | 633 |
| DOL (μm) | 6.7 | 10.0 | 9.8 | 8.8 | 8.8 | 7.2 |
| CT (MPa) | 60.3 | 52.2 | 60.5 | 56.6 | 62.6 | 60.7 |
| Wt. Gain (%) | — | — | — | — | — | — |
| IOX Temp. (° C.) | 450 | 450 | 450 | 450 | 450 | 450 |
| IOX Time (Hours) | 12 | 12 | 12 | 12 | 12 | 12 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 608 | 496 | — | 583 | 558 | 607 |
| DOL (μm) | 8.5 | 9.8 | — | 10.2 | 10.7 | 8.4 |
| CT (MPa) | 64.9 | 54.4 | — | 58.6 | 64.5 | 65.0 |
| Wt. Gain (%) | 0.71% | 0.74% | — | 0.71% | 0.79% | 0.75% |
| IOX Temp, (° C.) | 450 | 450 | 450 | 450 | 450 | 450 |
| IOX Time (Hours) | 16 | 16 | 16 | 16 | 16 | 16 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 590 | 483 | 505 | — | — | 592 |
| DOL (μm) | 9.3 | 11.8 | 11.6 | — | — | 10.2 |
| CT (MPa) | 65.1 | 50.6 | 58.7 | — | — | 63.4 |
| Wt. Gain (%) | 0.75% | 0.80% | 0.87% | — | — | 0.81% |

TABLE 6

| Composition Sample Number: | 13 | 14 | 15 | 16 | 17 | 18 |
|---|---|---|---|---|---|---|
| IOX Temp (° C.) | 450 | 450 | 450 | 450 | 450 | 450 |
| IOX Time (Hours) | 4 | 4 | 4 | 4 | 4 | 4 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | — | 611 | — | — | 613 | — |
| DOL (μm) | — | 6.4 | — | — | 6.2 | — |
| CT (MPa) | 41.3 | 37.9 | 50.3 | 52.6 | 42.9 | 47.4 |
| Wt. Gain (%) | 0.48% | 0.51% | 0.58% | 0.56% | 0.53% | 0.49% |
| IOX Temp (° C.) | 450 | 450 | 450 | 450 | 450 | 450 |
| IOX Time (Hours) | 8 | 8 | 8 | 8 | 8 | 8 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 609 | 518 | 583 | 624 | 516 | 590 |
| DOL (μm) | 6.5 | 8.9 | 7.3 | 6.8 | 8.9 | 6.9 |
| CT (MPa) | 53.8 | 44.1 | 58.8 | 60.5 | 48.5 | 54.1 |
| Wt. Gain (%) | — | — | — | — | — | — |
| IOX Temp (° C.) | 450 | 450 | 450 | 450 | 450 | 450 |
| IOX Time (Hours) | 12 | 12 | 12 | 12 | 12 | 12 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 569 | 484 | 539 | 560 | 478 | 552 |
| DOL (μm) | 9.0 | 9.2 | 8.3 | 8.5 | 8.8 | 8.2 |
| CT (MPa) | 59.3 | 46.8 | 55.0 | 65.6 | 50.9 | 59.5 |
| Wt. Gain (%) | 0.66% | 0.67% | 0.77% | 0.79% | 0.72% | 0.72% |
| IOX Temp (° C.) | 450 | 450 | 450 | 450 | 450 | 450 |
| IOX Time (Hours) | 16 | 16 | 16 | 16 | 16 | 16 |
| Bath Composition (%) | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ | 93 $KNO_3$/7 $NaNO_3$ |
| CS (MPa) | 539 | 443 | 519 | 541 | 454 | 533 |
| DOL (μm) | 8.7 | 9.7 | 8.9 | 8.8 | 10.4 | 9.6 |
| CT (MPa) | 56.5 | 46.8 | 57.2 | 60.6 | 47.4 | 57.4 |
| Wt. Gain (%) | 0.68% | 0.74% | 0.84% | 0.81% | 0.81% | 0.76% |

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of" limits the composition of a material to the specified materials and those that do not materially affect the basic and novel characteristic(s) of the material. As used in the claims, "consisting of" or "composed entirely of" limits the composition of a material to the specified materials and excludes any material not specified.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, for example within about 5% of each other, or within about 2% of each other.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed:

1. A glass article, comprising:
   50 mol % to 61 mol % $SiO_2$;
   13 mol % to 20 mol % $Al_2O_3$;
   6 mol % or more $B_2O_3$;
   0 mol % to 5 mol % MgO;
   0 mol % to 2 mol % CaO;
   8 mol % to 14 mol % $Li_2O$;
   0 mol % to 4 mol % $Na_2O$; and
   0 mol % to 1 mol % $K_2O$,
   wherein:
   $Al_2O_3$ mol %>$R_2O$+R'O−3 mol %,
   $R_2O$ is the total mol % of alkali metal oxides, and
   R'O is the total mol % of alkaline earth metal oxide.

2. The glass article of claim 1, comprising 8 mol % to 12 mol % $B_2O_3$.

3. The glass article of claim 1, further comprising $TiO_2$ in a range of 0 mol % to 2 mol %.

4. The glass article of claim 1, further comprising $ZrO_2$ in a range of 0 mol % to 2 mol %.

5. The glass article of claim 1, further comprising $SnO_2$ in a range of 0 mol % to 2 mol %.

6. The glass article of claim 1, further comprising $Fe_2O_3$ in a range of 0 mol % to 0.1 mol %.

7. The glass article of claim 1, wherein the $B_2O_3$ comprises trigonal boron oxide.

8. The glass article of claim 7, wherein 50 mol % or more of the $B_2O_3$ comprises trigonal boron oxide.

9. The glass article of claim 1, wherein the amount of $Al_2O_3$+the amount of $B_2O_3$ is 20 mol % or more.

10. The glass article of claim 1, wherein $Al_2O_3$ mol %>$R_2O$+R'O.

11. The glass article of claim 1, wherein $R_2O$+R'O+4 mol %>$Al_2O_3$ mol %>$R_2O$+R'O−3 mol %.

12. The glass article of claim 1, wherein the glass article is substantially free of $ZrO_2$, $Ta_2O_5$, $TiO_2$, $HfO_2$, $La_2O_3$, and $Y_2O_3$.

13. The glass article of claim 1, comprising a compressive stress region extending from a surface of the glass article to a depth of compression.

14. A consumer electronic product, comprising:
   a housing having a front surface, a back surface, and side surfaces;
   electrical components provided at least partially within the housing, the electrical components including at least a controller, a memory, and a display, the display being provided at or adjacent the front surface of the housing; and a cover glass disposed over the display,
wherein at least one of a portion of the housing or a portion of the cover glass comprises a glass article comprising:
50 mol % to 61 mol % $SiO_2$;
13 mol % to 20 mol % $Al_2O_3$;
6 mol % $B_2O_3$ or more;
0 mol % to 5 mol % MgO;
0 mol % to 2 mol % CaO;
8 mol % to 14 mol % $Li_2O$;
0 mol % to 4 mol % $Na_2O$; and
0 mol % to 1 mol % $K_2O$,
wherein:
$Al_2O_3$ mol %>$R_2O$+R'O−3 mol %,
$R_2O$ is the total mol % of alkali metal oxides, and
R'O is the total mol % of alkaline earth metal oxides.

15. The consumer electronic product of claim 14, comprising 6 mol % of $B_2O_3$ to 16 mol % $B_2O_3$.

* * * * *